United States Patent
Arai

(10) Patent No.: US 7,157,325 B2
(45) Date of Patent: Jan. 2, 2007

(54) METHOD FOR FABRICATING SEMICONDUCTOR MEMORY DEVICE

(75) Inventor: Masatoshi Arai, Nara (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 10/959,984

(22) Filed: Oct. 8, 2004

(65) Prior Publication Data

US 2005/0085041 A1   Apr. 21, 2005

(30) Foreign Application Priority Data

Oct. 20, 2003   (JP) .............................. 2003-359641

(51) Int. Cl.
    *H01L 21/32* (2006.01)
(52) U.S. Cl. ...................... 438/221; 438/258; 438/424; 438/514; 438/587; 438/763; 438/778; 438/787; 438/961
(58) Field of Classification Search ................ 438/218, 438/221, 258, 424, 514, 587, 763, 778, 787, 438/791, 954, 961, FOR. 154, FOR. 388
    See application file for complete search history.

(56) References Cited

U.S. PATENT DOCUMENTS

| | | | |
|---|---|---|---|
| 5,756,385 A * | 5/1998 | Yuan et al. .................. 438/258 |
| 6,482,708 B1 * | 11/2002 | Choi et al. ................... 438/303 |
| 2002/0041526 A1 * | 4/2002 | Sugita et al. ................ 365/200 |
| 2002/0045320 A1 * | 4/2002 | Choi et al. ................... 438/303 |
| 2002/0130356 A1 * | 9/2002 | Sung et al. .................. 257/316 |
| 2002/0146885 A1 * | 10/2002 | Chen .......................... 438/288 |
| 2002/0192910 A1 * | 12/2002 | Ramsbey et al. ........... 438/257 |
| 2003/0036234 A1 * | 2/2003 | Doi ............................. 438/266 |
| 2003/0124777 A1 * | 7/2003 | Kim ............................ 438/129 |
| 2003/0181000 A1 * | 9/2003 | Mori ........................... 438/200 |

FOREIGN PATENT DOCUMENTS

JP         6-151876        5/1994

* cited by examiner

*Primary Examiner*—George Fourson
*Assistant Examiner*—Joannie Adelle Garcia
(74) *Attorney, Agent, or Firm*—McDermott Will & Emery LLP

(57) ABSTRACT

A method for fabricating a semiconductor memory device in which a logic circuit and a nonvolatile memory are provided on a semiconductor substrate includes the steps of: forming an isolation region; forming a protective film made of an insulating material over the semiconductor substrate in a logic circuit region and a nonvolatile memory region; selectively introducing impurity ions in part of the semiconductor substrate in the logic circuit region; and removing the protective film formed over the logic circuit region. The step of introducing the impurity ions is performed before the step of removing the protective film is performed.

12 Claims, 18 Drawing Sheets

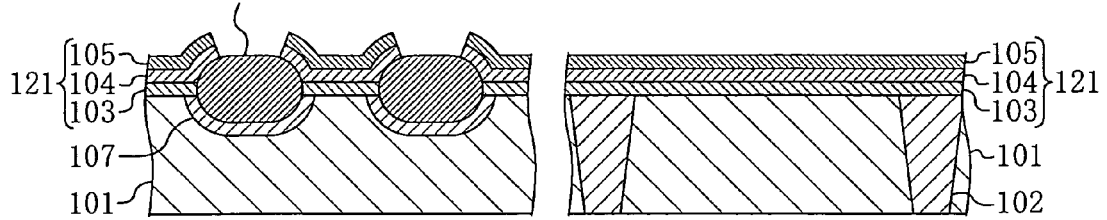
FIG. 5A
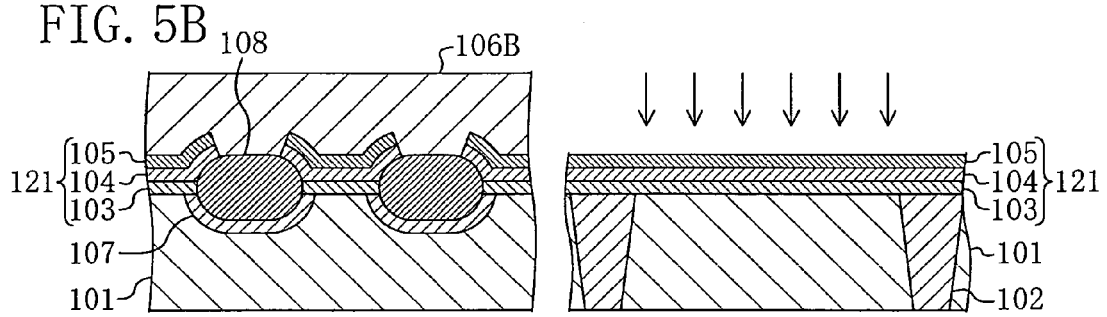
FIG. 5B
FIG. 5C
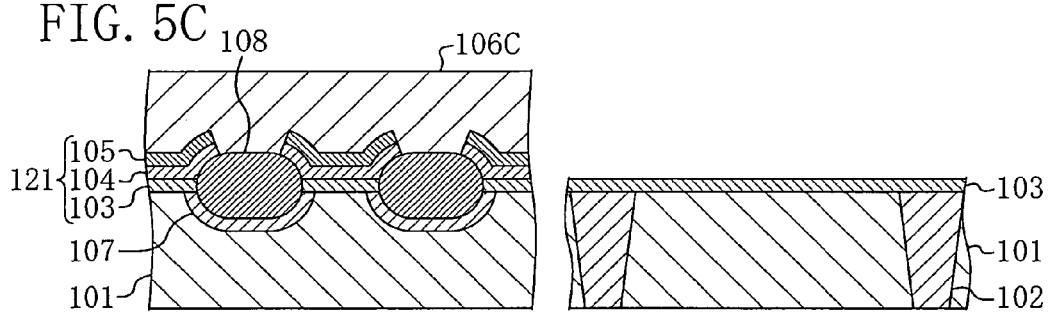
FIG. 5D
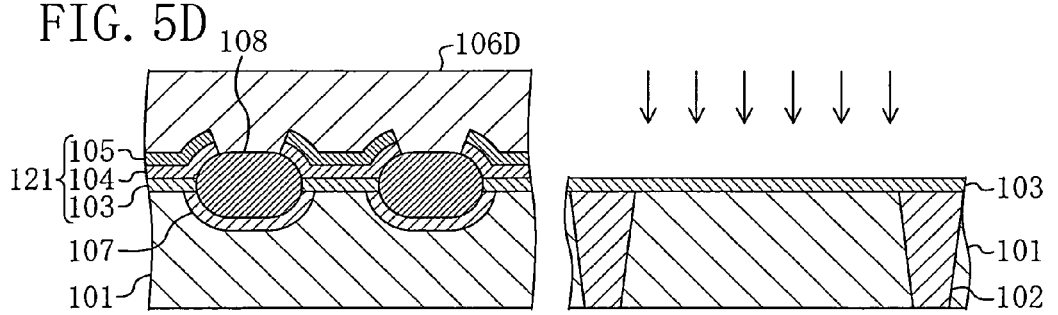
FIG. 5E
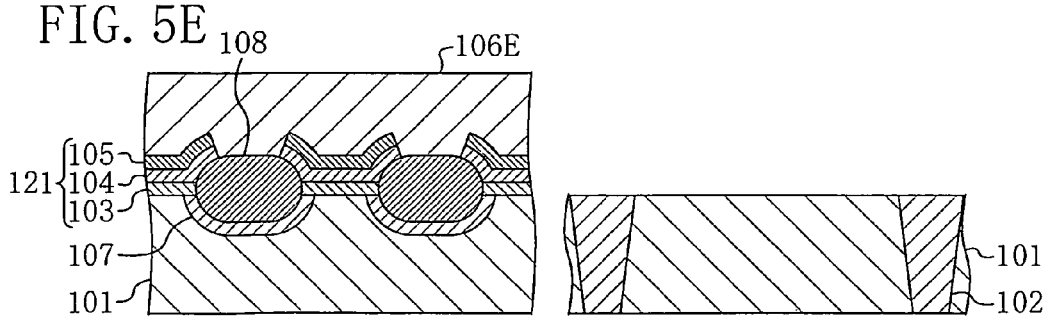

METHOD FOR FABRICATING SEMICONDUCTOR MEMORY DEVICE

CROSS-REFERENCE TO RELATED APPLICATION

The disclosure of Japanese Patent Application No. 2003-359641 filed in Oct. 20, 2003 including claims, specification and drawings is incorporated herein by reference in its entirety.

BACKGROUND OF THE INVENTION

The present invention relates to a method for fabricating a semiconductor device in which a logic circuit and a nonvolatile memory are incorporated.

In recent years, to achieve multifunctionality and easy debugging, attention has been given to embedded flash memories in each of which a logic circuit and a nonvolatile memory are incorporated. A logic circuit incorporated in such an embedded flash memory needs to have the same function as that obtained when only the logic circuit is provided.

To fabricate an embedded flash memory, however, a process for fabricating a nonvolatile memory needs to be added to a usual process for fabricating a logic circuit. This additional process for fabricating a nonvolatile memory causes characteristics of the logic circuit to differ from those obtained when only the logic circuit is fabricated.

Accordingly, if a logic circuit optimized for a usual fabrication process for a logic circuit is fabricated by a fabrication process for an embedded flash memory, characteristics of the logic circuit are caused to change, and desirable characteristics are not obtained. If the logic circuit is optimized for the fabrication process for an embedded flash memory, desirable characteristics will not be obtained as well in a future process for fabricating a semiconductor device from which a nonvolatile memory has been removed.

The characteristics of the logic circuit change mainly because an insulating film buried in a trench isolation is etched during the fabrication of the nonvolatile memory. When the buried insulating film is etched, a reverse narrow channel effect, i.e., the phenomenon that an electric field from a gate electrode is concentrated at the end of the trench isolation to reduce the threshold voltage of a transistor, becomes conspicuous.

The buried insulating film is etched deeply especially in a process using hydrofluoric acid or a process using a mixed solution (an Ammonia Hydroxide-Peroxide Mixture: APM solution) which includes ammonia water and hydrogen peroxide and is generally called ammonia acid. Examples of the process using hydrofluoric acid include the process of removing a natural oxide film. Examples of the process using an APM solution include RCA cleaning typically used to clean a substrate or to remove a photoresist. These processes are repeatedly performed not only in the process of fabricating a logic circuit but also in the process of fabricating a nonvolatile memory, so that the addition of the process for fabricating a nonvolatile memory causes extra etching of the buried insulating film in the fabrication process for an embedded flash memory.

In an embedded flash memory, a high-voltage transistor for controlling write or erase operation is needed in a logic circuit. To form the high-voltage transistor, implantations for forming a well and for controlling a threshold voltage using photoresists for forming the high-voltage transistor as masks are required after a trench isolation has been formed, resulting in extra etching of a buried insulating film during removal of the resists.

As described above, the formation of an embedded flash memory involves extra etching of a buried insulating film to a greater extent than in the case of forming only a logic circuit. Consequently, characteristics of the logic circuit change.

As a means for suppressing etching of the buried insulating film in the trench isolation, the following method is proposed in Japanese Unexamined Patent Publication (Kokai) No. 6-151876. FIGS. 19A through 19C are cross-sectional views showing respective process steps of a conventional method for fabricating a semiconductor memory device in order.

First, as shown in FIG. 19A, an isolation film 10 and a tunnel film 14 are formed on a silicon substrate 2. Then, as shown in FIG. 19B, a first polysilicon film 16 is formed within a memory cell region M1, and then an ONO film 18 as a stack of silicon dioxide ($SiO_2$), silicon nitride (SiN) and silicon dioxide ($SiO_2$) is formed over the entire surface of the substrate including a peripheral transistor region T1.

Next, as shown in FIG. 19C, the ONO film 18 is removed except for parts located on the memory cell region M1 and the isolation film 10. Thereafter, a second polysilicon film 20 is formed and then gate electrodes are formed, thereby forming transistors in the memory cell region M1 and the peripheral transistor region T1.

With the structure described above, the ONO film 18 formed on the isolation film 10 serves as a protective film for preventing the isolation film 10 from being etched. Accordingly, during removal of a natural oxide film and RCA cleaning which are repeatedly performed to form the transistors in the memory cell region M1 and the peripheral transistor region T1, the isolation film 10 is not etched so that the film thickness is not reduced. As a result, deterioration of electrical characteristics of transistors caused by reduction of the film thickness of the isolation film 10 is prevented.

However, the conventional method for fabricating a semiconductor memory device has the problem that the protective film, i.e., the ONO film, remaining on the isolation region causes charge to be captured in the protective film on the isolation region, so that the property of isolating the transistors deteriorates. This is because of the following reason. A silicon nitride film tends to capture charge, and thus charge is easily trapped in the silicon nitride film when an electrical stress is applied in, for example, a process for forming transistors. The trapped charge is held, resulting in that a parasitic transistor is formed.

As to a structure in which the protective film remains only on the isolation region, part of the protective film inevitably overlaps an active region in an actual fabrication process. This overlapping part of the protective film serves as a gate insulating film, causing the problem that a mask misalignment or a variation in size greatly change characteristics of peripheral transistors in a logic circuit.

Optimization of the logic circuit with the protective film left causes another problem that a protective film is needed so as to keep characteristics of the logic circuit from changing or that another logic circuit needs to be optimized when a product from which a nonvolatile memory has been removed is fabricated after termination of debugging.

SUMMARY OF THE INVENTION

It is therefore an object of the present invention to fabricate a semiconductor memory device in which deterioration of characteristics of a logic circuit caused by a protective film remaining in an isolation region is prevented and which has a high. reliability without complicated fabrication processes.

In order to achieve this object, according to the present invention, a method for fabricating a semiconductor memory device in which a logic circuit and a nonvolatile memory are incorporated includes the step of forming a protective film and the step of removing the protective film.

Specifically, a method for fabricating a semiconductor memory device according to the present invention is a method for fabricating a semiconductor memory device in which a logic circuit and a nonvolatile memory are provided on a semiconductor substrate. The method includes the steps of: forming a trench in the semiconductor substrate and burying an insulating film in the trench, thereby forming an isolation region; forming a protective film made of an insulating material over the semiconductor substrate in a logic circuit region where the logic circuit is to be formed and a nonvolatile memory region where the nonvolatile memory is to be formed; selectively introducing impurity ions in part of the semiconductor substrate in the logic circuit region; and removing the protective film formed over the logic circuit region. The step of introducing the impurity ions is performed before the step of removing the protective film is performed.

With this method, it is possible to prevent the insulating film in the isolation region from being etched in each step, thus avoiding degradation of the property of isolating transistors from each other. In addition, the protective film is used as a surface protective film for preventing damages on the surface layer and contamination thereof in the step of introducing impurity ions, so that process steps are simplified.

The protective film formed in the logic circuit region is removed after the implantation of the impurity ions, thus preventing formation of a parasitic transistor caused by the protective film remaining in the isolation region. As a result, a highly-reliable semiconductor memory device is implemented. In addition, a logic circuit can be designed under the same conditions as those for the case of forming only the logic circuit.

In the method of the present invention, the protective film preferably serves as a trap film in which charge is accumulated in the nonvolatile memory region. With this method, the protective film is also used as a trap film in which charge in the nonvolatile memory region is accumulated, so that an additional process of forming a protective film is not needed. This simplifies process steps.

The method of the present invention preferably further includes the steps of: forming a first conductive film on the semiconductor substrate in the nonvolatile memory region after the step of forming the isolation region has been performed and before the step of forming the protective film is performed; and forming a second conductive film on the protective film after the step of forming the protective film has been performed. The protective film preferably serves as an insulating film for insulating the first conductive film and the second conductive film from each other.

With this method, in the case of forming a nonvolatile memory having a double gate structure in which the first conductive film serves as a floating gate and the second conductive film serves as a control gate, deterioration of the isolation region in the logic circuit section is minimized. The use of the insulating film for insulating the floating gate and the control gate from each other as the protective film eliminates the necessity of a process for forming an additional protective film, so that process steps are simplified.

In the method of the present invention, the protective film is preferably made of a material having a lower etching rate with respect to hydrofluoric acid than that of the insulating film buried in the trench. With this method, the isolation region is protected especially during the removal of a natural oxide film.

In the method of the present invention, the protective film is preferably made of a material having a lower etching rate with respect to a mixed solution including ammonia water and hydrogen peroxide than that of the insulating film buried in the trench. With this method, the isolation region is protected especially during an RCA cleaning process.

In the method of the present invention, the protective film is preferably a single layer of either a silicon nitride film or a silicon oxynitride film. Then, the process of forming the protective film is simplified.

In the method of the present invention, the protective film is preferably a multilayer film made of a plurality of insulating films including at least one of a silicon nitride film and a silicon oxynitride film. This method ensures protection of the isolation region and also ensures the use of the protective film as a trap film or an insulating film in the nonvolatile memory region.

In the method of the present invention, the multilayer film is preferably a stack of a silicon oxide film, either a silicon nitride film or a silicon oxynitride film, and a silicon oxide film. This method ensures protection of the isolation region and also ensures the use of the protective film as a trap film or an insulating film with more excellent function in the nonvolatile memory region. In addition, the staked films are easily etched in order.

In the method of the present invention, the step of introducing the impurity ions preferably includes a first impurity introducing step for forming a well and a second impurity introducing step for controlling a threshold voltage. The method preferably further includes the step of selectively removing at least one of the plurality of insulating films before the second impurity introducing step is performed. With this method, the thickness of the protective film is reduced in the impurity introducing step for adjusting a threshold voltage, so that an additional protective film is not needed, thus ensuring introduction of an impurity for adjusting a threshold voltage into a shallow part.

The method of the present invention preferably further includes, after the step of selectively removing the protective film, the steps of: forming a conductive material over the logic circuit region and the nonvolatile memory region; and selectively etching the conductive material, thereby forming gate electrodes in the logic circuit region and the nonvolatile memory region. This method ensures formation of gate electrodes free from an influence of the protective film.

As described above, with a method for fabricating a semiconductor memory device according to the present invention, a highly-reliable semiconductor memory device in which deterioration of characteristics of a logic circuit caused by a protective film remaining in an isolation region is prevented is implemented without complicated fabrication processes.

BRIEF DESCRIPTION OF THE DRAWINGS

FIGS. 5A through 5E are cross-sectional views showing respective process steps of a method for fabricating a semiconductor memory device according to the second embodiment.

DESCRIPTION OF THE PREFERRED EMBODIMENTS

Embodiment 1

FIGS. 1A through 1D, 2A through 2C and 3A through 3D are cross-sectional views showing respective process steps of a method for fabricating a semiconductor memory device according to a first embodiment of the present invention. In FIGS. 1A through 3D, left-side parts represent a nonvolatile memory region (where a nonvolatile memory is to be formed) and right-side parts represent a logic circuit region (where a logic circuit is to be formed).

Figure 1A:
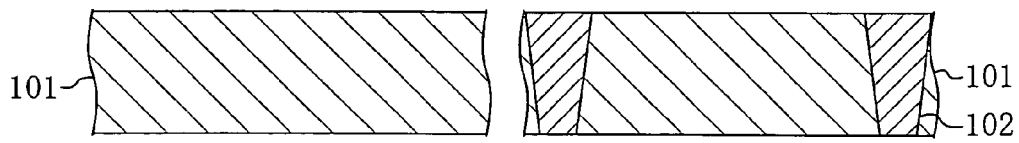
FIGS. 1A through 1D are cross-sectional views showing respective process steps of a method for fabricating a semiconductor memory device according to a first embodiment of the present invention.

First, as shown in FIG. 1A, trenches whose sidewalls are vertical or tapered downward in cross section are formed in a semiconductor substrate 101 made of silicon in the logic circuit region. Then, a silicon oxide film is buried in the trenches, thereby forming isolation regions 102 serving as trench isolations.

Figure 1B:
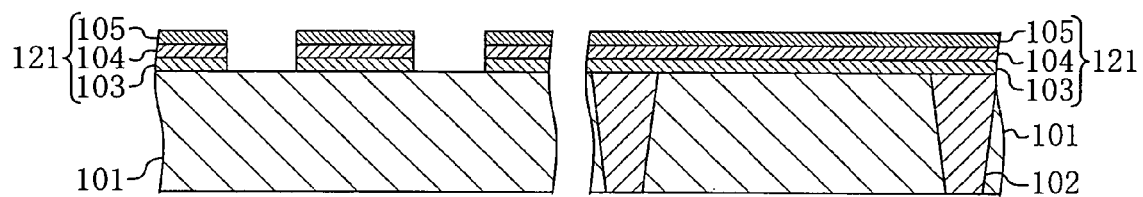

Next, as shown in FIG. 1B, a lower oxide film 103 of silicon dioxide ($SiO_2$) with a thickness of 7 nm, a silicon nitride film 104 of silicon nitride (SiN) with a thickness of 7 nm and an upper oxide film 105 of silicon dioxide ($SiO_2$) with a thickness of 12 nm are formed in this order in both the logic circuit region and the nonvolatile memory region, thereby forming an ONO (Oxide-Nitride-Oxide) film 121. The lower oxide film 103 is formed by heat treatment performed at 900° C. in an atmosphere containing oxygen. The silicon nitride film 104 is formed by a low pressure CVD (LPCVD) process performed at 700° C. The upper oxide film 105 is formed by heat treatment performed at 1000° C. in an atmosphere containing oxygen.

Figure 1C:
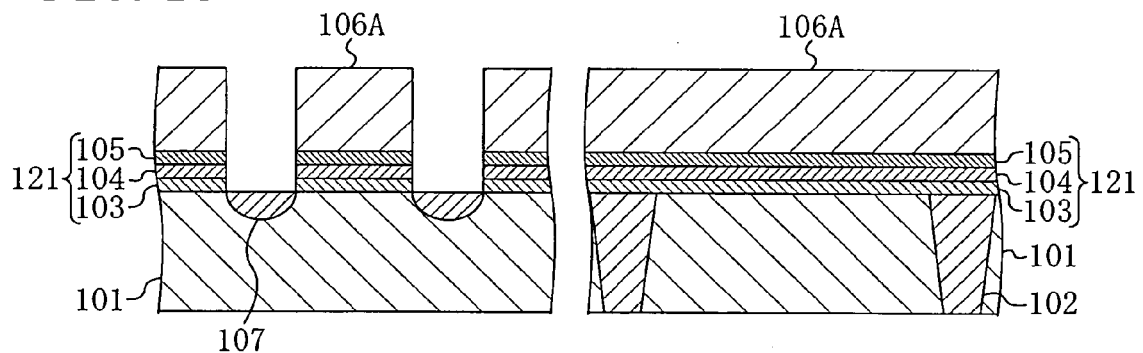
Figure 1D:
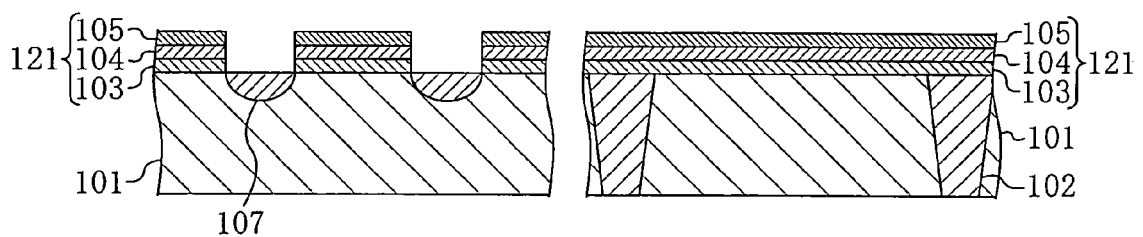

Then, as shown in FIG. 1C, in the nonvolatile memory region, the upper oxide film 105, the silicon nitride film 104 and the lower oxide film 103 are selectively dry-etched in this order using a photoresist 106A as a mask, and then arsenic is implanted using the same mask, thereby forming an n-type doped layer 107. Subsequently, as shown in FIG. 1D, the photoresist 106A is removed. The implantation of arsenic only needs to be performed at an implantation voltage of 30 keV at a density of $3 \times 10^{15}$ $cm^{-2}$.

Figure 2A:
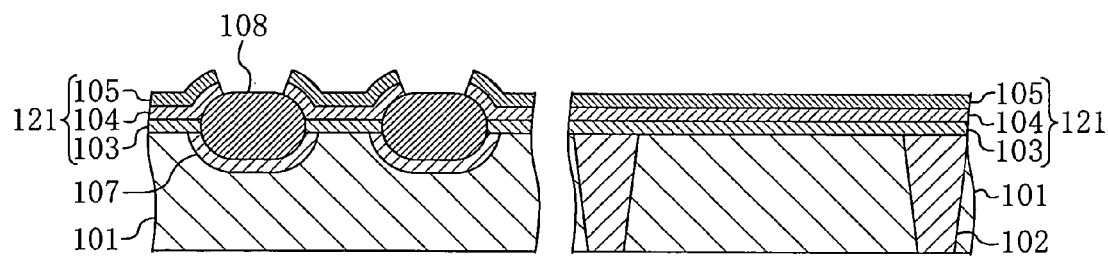
FIGS. 2A through 2C are cross-sectional views showing respective process steps of a method for fabricating a semiconductor memory device according to the first embodiment.
Figure 2B:
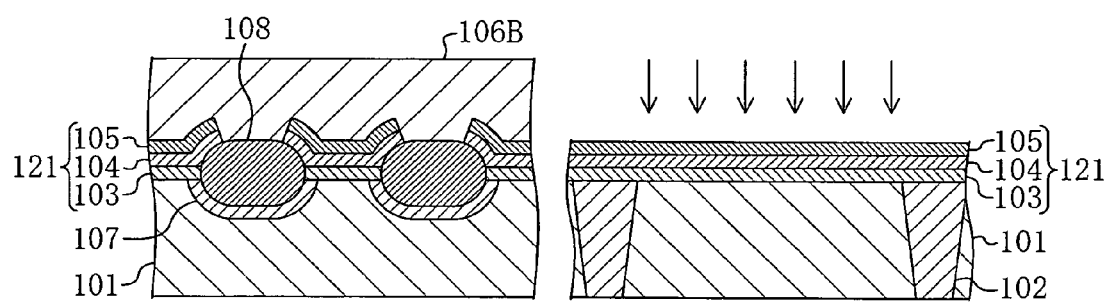

Thereafter, as shown in FIG. 2A, heat treatment is performed at 900° C. for 10 minutes in an oxygen atmosphere, for example, thereby forming an on-doped-layer insulating film 108 in the nonvolatile memory region. Then, as shown in FIG. 2B, ion implantation is performed on the logic circuit region using a photoresist 106B as a mask, thereby forming a well for a transistor which is to be formed in the logic circuit region and adjusting the threshold voltage of the transistor.

The ion implantation for forming the well for the transistor in the logic circuit region is performed by implanting boron at an implantation voltage of 300 keV at a density of $1 \times 10^{13}$ $cm^{-2}$, for example. The ion implantation for adjusting the threshold voltage is performed by implanting boron at an implantation voltage of 30 keV at a density of $5 \times 10^{12}$ cm$^{-2}$, for example. In the ion implantation for forming the well and the ion implantation for adjusting the threshold voltage, the ONO film 121 is used as a surface protective film.

Figure 2C:
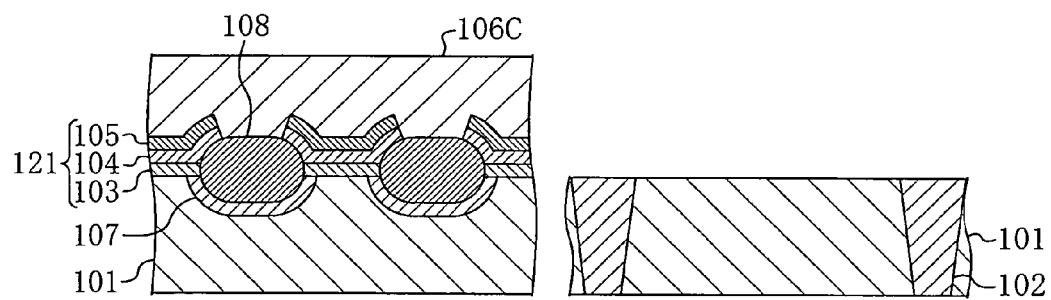

Then, as shown in FIG. 2C, in the logic circuit region, the upper oxide film 105, the silicon nitride film 104 and the lower oxide film 103 are selectively removed in this order using a photoresist 106C as a mask.

Figure 3A:
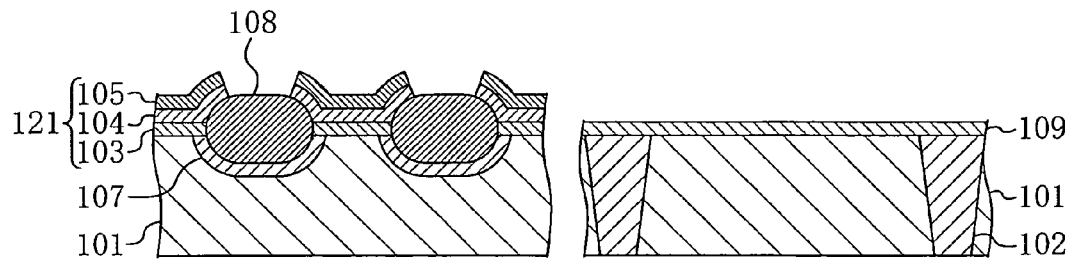
FIGS. 3A through 3D are cross-sectional views showing respective process steps of a method for fabricating a semiconductor memory device according to the first embodiment.
Figure 3B:
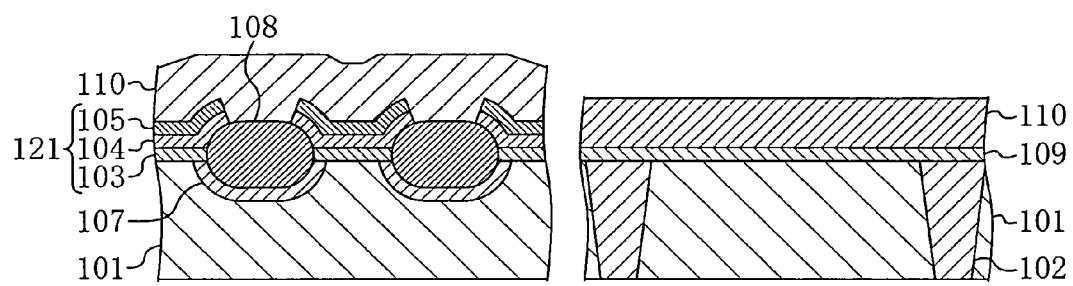

Thereafter, as shown in FIG. 3A, heat treatment is performed at 900° C. in an atmosphere containing oxygen, thereby forming a gate insulating film 109 of SiO$_2$ with a thickness of 10 nm in the logic circuit region. Then, as shown in FIG. 3B, a polycrystalline silicon film 110 is deposited by an LPCVD process performed at 600° C. to a thickness of 200 nm over the entire surface of the semiconductor substrate 101.

Figure 3C:
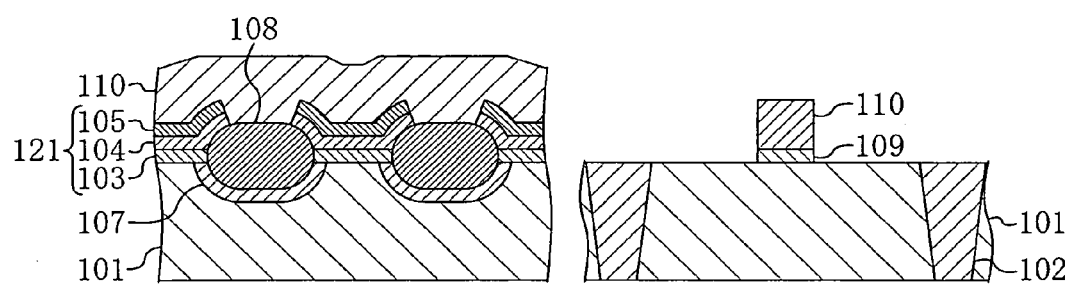

Subsequently, etching is performed using a mask, thereby forming gate electrodes at desired positions in the nonvolatile memory region and the logic circuit region, as shown in FIG. 3C. It should be noted that FIG. 3C shows a cross section along the direction of a word line formed by connecting gate electrodes in respective adjacent memory regions, so that the cross-sectional structure shown in FIG. 3C is the same as that shown in FIG. 3B before the patterning.

Figure 3D:
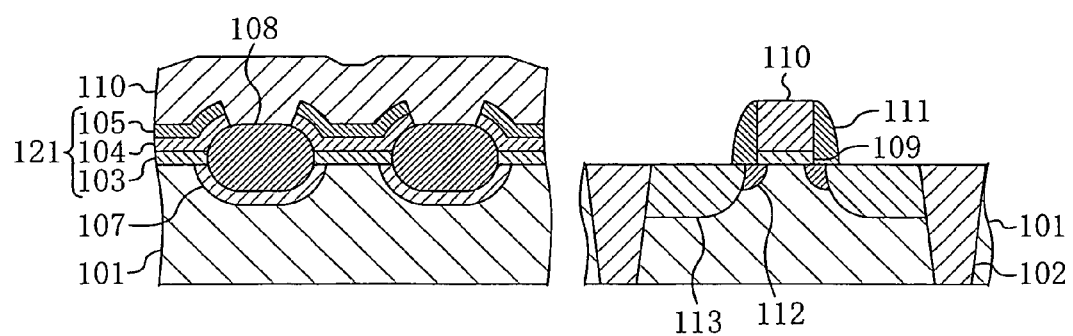

Then, as shown in FIG. 3D, a lightly-doped layer 112, sidewalls 111 and a heavily-doped layer 113 are formed by known techniques for each of the transistors in the logic circuit region, thereby completing a semiconductor memory device.

As described above, with the method for fabricating a semiconductor memory device of this embodiment, the isolation regions 102 with trench structures are protected by the ONO film 121 during the formation of a nonvolatile memory. Accordingly, properties of the isolation regions are not degraded, and thus a highly-reliable semiconductor memory device is obtained. The ONO film 121 serves as a trap film for the nonvolatile memory, so that an additional process step of forming a protective film is not needed. This allows process steps to be simplified.

In addition, the ONO film 121 is used as a surface protective film during the ion implantation. Accordingly, the process of the ion implantation can be simplified.

Furthermore, the ONO film 121 is removed in the logic circuit region after the ion implantation, so that no parasitic transistor is formed on the isolation regions and thus the property of isolating transistors from each other is not degraded. A transistor in the resultant logic circuit has the same structure as that obtained by a usual process of forming only a logic circuit. Accordingly, in the case where debugging is performed by using a device including a nonvolatile memory and then a device from which the nonvolatile memory is removed is made commercially available, it is unnecessary to change the design of the logic circuit, for example.

In this embodiment, the ONO film 121 serves as a trap film in the nonvolatile memory region and also as a protective film in the logic circuit region. Alternatively, a single film made of only a silicon nitride film or a multilayer film made of a lower oxide film and a silicon nitride film may be used. A silicon oxynitride film (SiON) may be used instead of the silicon nitride film. The ONO film 121 may be formed over the entire surface of the semiconductor substrate 101, or only on the isolation regions 102 or a region on which ion implantation is to be performed in each of the nonvolatile memory region and the logic circuit region.

In this embodiment, the ion implantation for forming the well and the ion implantation for controlling the threshold voltage are performed on the logic circuit region using the same mask. However, these implantations may be performed using different masks.

In this embodiment, after the upper oxide film 105, the silicon nitride film 104 and the lower oxide film 103 have been etched in this order in the nonvolatile memory region using a mask, the n-type doped layer 107 is formed using the same mask. Alternatively, the ONO film 121 may be etched after the formation of the n-type doped layer 107.

Embodiment 2

FIGS. 4A through 4D, 5A through 5E and 6A through 6D are cross-sectional views showing respective process steps of a method for fabricating a semiconductor memory device according to a second embodiment of the present invention. In FIGS. 4A through 6D, left-side parts represent a nonvolatile memory region and right-side parts represent a logic circuit region.

Figure 4A:
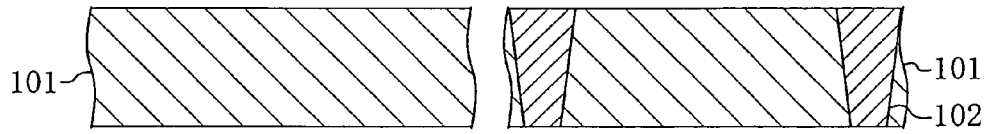
FIGS. 4A through 4D are cross-sectional views showing respective process steps of a method for fabricating a semiconductor memory device according to a second embodiment of the present invention.

First, as shown in FIG. 4A, trenches whose sidewalls are vertical or tapered downward in cross section are formed in a semiconductor substrate 101 made of silicon in the logic circuit region. Then, a silicon oxide film is buried in the trenches, thereby forming isolation regions 102 serving as trench isolations.

Figure 4B:
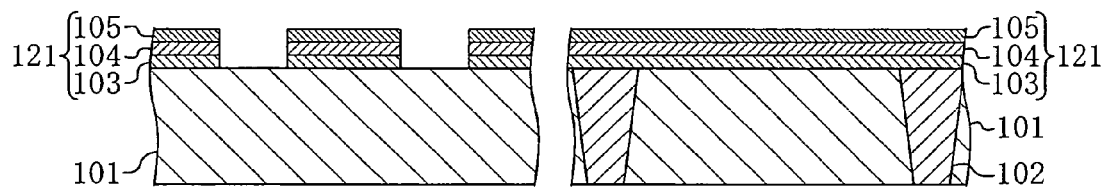

Next, as shown in FIG. 4B, a lower oxide film 103 of silicon dioxide (SiO$_2$) with a thickness of 7 nm, a silicon nitride film 104 of silicon nitride (SiN) with a thickness of 7 nm and an upper oxide film 105 of silicon dioxide (SiO$_2$) with a thickness of 12 nm are formed in this order in both the logic circuit region and the nonvolatile memory region, thereby forming an ONO film 121. The lower oxide film 103 is formed by heat treatment performed at 900° C. in an atmosphere containing oxygen. The silicon nitride film 104 is formed by a low pressure CVD (LPCVD) process performed at 700° C. The upper oxide film 105 is formed by heat treatment performed at 1000° C. in an atmosphere containing oxygen.

Figure 4C:
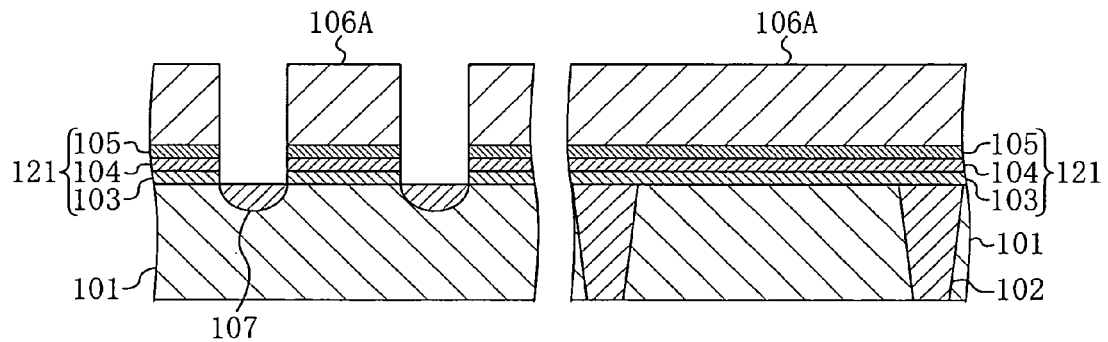
Figure 4D:
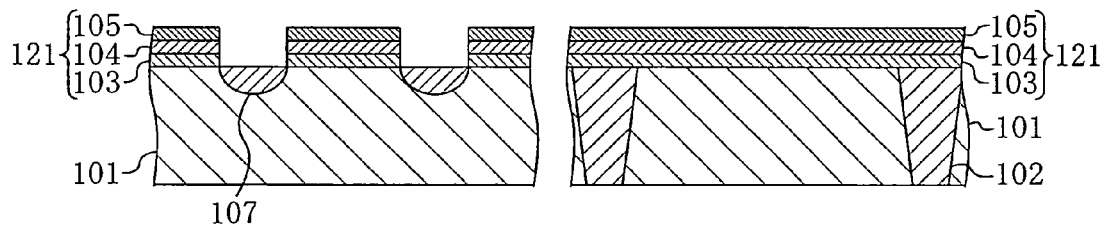

Then, as shown in FIG. 4C, in the nonvolatile memory region, the upper oxide film 105, the silicon nitride film 104 and the lower oxide film 103 are selectively dry-etched in this order using a photoresist 106A as a mask, and then arsenic is implanted using the same mask, thereby forming an n-type doped layer 107. Subsequently, as shown in FIG. 4D, the photoresist 106A is removed. The implantation of arsenic only needs to be performed at an implantation voltage of 30 keV at a density of $3 \times 10^{15}$ cm$^{-2}$.

Thereafter, as shown in FIG. 5A, heat treatment is performed at 900° C. for 10 minutes in an oxygen atmosphere, for example, thereby forming an on-doped-layer insulating film 108 in the nonvolatile memory region. Then, as shown in FIG. 5B, ion implantation is performed on the logic circuit region using a photoresist 106B as a mask, thereby forming a well for a transistor which is to be formed in the logic circuit region.

After the formation of the well, as shown in FIG. 5C, etching is performed using a photoresist 106C as a mask to remove the upper oxide film 105 and the silicon nitride film 104 in the logic circuit region. Subsequently, as shown in FIG. 5D, ion implantation is performed on the logic circuit region using a photoresist 106D as a mask, thereby adjusting the threshold voltage.

The ion implantation for forming the well for the transistor in the logic circuit region is performed by implanting boron at an implantation voltage of 300 keV at a density of $1 \times 10^{13}$ cm$^{-2}$, for example. The ion implantation for adjusting the threshold voltage is performed by implanting boron at an implantation voltage of 30 keV at a density of $5\times10^{12}$ cm$^{-2}$, for example.

In the ion implantation for forming the well, the ONO film 121 made of three layers of the upper oxide film 105, the silicon nitride film 104 and the lower oxide film 103 is used as a surface protective film. In the ion implantation for adjusting the threshold voltage, only the lower oxide film 103 is used as a surface protective film.

Then, as shown in FIG. 5C, in the logic circuit region, the lower oxide film 103 is selectively removed using a photoresist 106E as a mask.

Figure 6A:
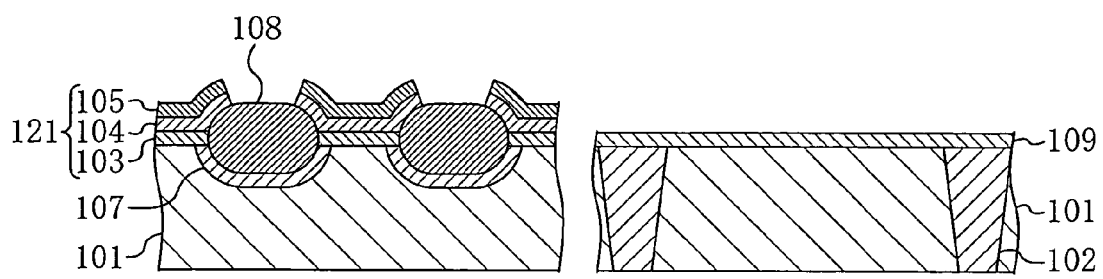
FIGS. 6A through 6D are cross-sectional views showing respective process steps of a method for fabricating a semiconductor memory device according to the second embodiment.
Figure 6B:
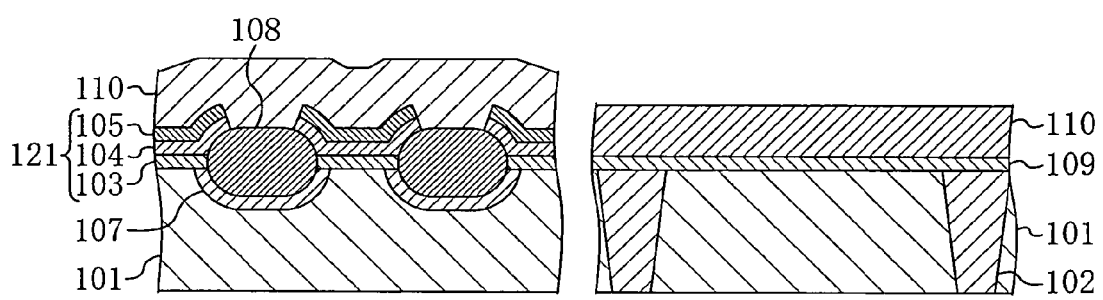

Thereafter, as shown in FIG. 6A, heat treatment is performed at 900° C. in an atmosphere containing oxygen, thereby forming a gate insulating film 109 of SiO$_2$ with a thickness of 10 nm in the logic circuit region. Then, as shown in FIG. 6B, a polycrystalline silicon film 110 is deposited by an LPCVD process performed at 600° C. to a thickness of 200 nm over the entire surface of the semiconductor substrate 101.

Figure 6C:
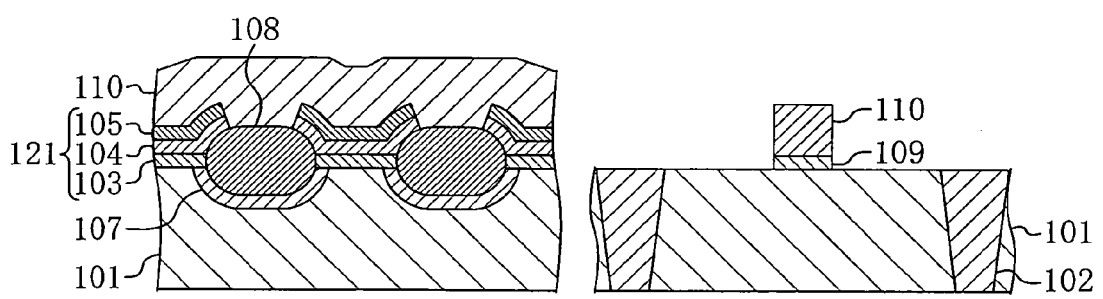

Subsequently, etching is performed using a mask, thereby forming gate electrodes at desired positions in the nonvolatile memory region and the logic circuit region, as shown in FIG. 6C. It should be noted that FIG. 6C shows a cross section along the direction of a word line formed by connecting gate electrodes in respective adjacent memory regions, so that the cross-sectional structure shown in FIG. 6C is the same as that shown in FIG. 6B before the patterning.

Figure 6D:
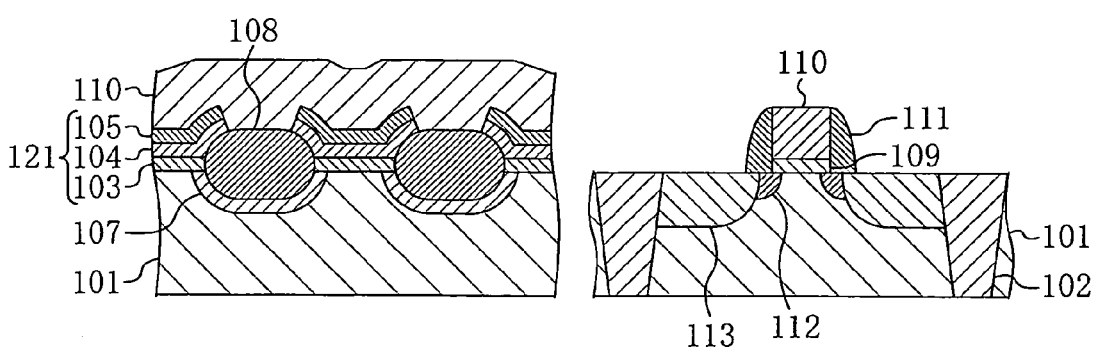

Then, as shown in FIG. 6D, a lightly-doped layer 112, sidewalls 111 and a heavily-doped layer 113 are formed by known techniques for each of the transistors in the logic circuit region, thereby completing a semiconductor memory device.

As described above, with the method for fabricating a semiconductor memory device of this embodiment, the isolation regions 102 with trench structures are protected by the ONO film 121 during the formation of a nonvolatile memory. Accordingly, properties of the isolation regions are not degraded, and thus a highly-reliable semiconductor memory device is obtained. The ONO film 121 serves as a trap film for the nonvolatile memory, so that an additional process step of forming a protective film is not needed. This allows process steps to be simplified.

In this embodiment, the ONO film 121 made of the three layers of the upper oxide film 105, the silicon nitride film 104 and the lower oxide film 103 is used as a surface protective film during the formation of the well, whereas only the lower oxide film 103 is used as a surface protective film during the ion implantation for adjusting the threshold voltage. In the adjustment of the threshold voltage, ion implantation need to be performed on a part as shallow as possible in the semiconductor substrate in order to reduce the size of a transistor. In this embodiment, the upper oxide film 105 and the silicon nitride film 104 are removed so that ion implantation is performed through a thin surface protective film. Consequently, ion implantation into a shallower part is easily performed, thus enabling miniaturization of a transistor with ease.

Furthermore, the ONO film 121 is removed in the logic circuit region after the ion implantation, so that no parasitic transistor is formed on the isolation regions and thus the property of isolating transistors from each other is not degraded. A transistor in the resultant logic circuit has the same structure as that obtained by a usual process of forming only a logic circuit. Accordingly, in the case where debugging is performed by using a device including a nonvolatile memory and then a device from which the nonvolatile memory is removed is made commercially available, it is unnecessary to change the design of the logic circuit, for example.

In this embodiment, the ONO film 121 serves as a trap film in the nonvolatile memory region and also as a protective film in the logic circuit region. Alternatively, a single film made of only a silicon nitride film or a multilayer film made of a lower oxide film and a silicon nitride film may be used. A silicon oxynitride film (SiON) may be used instead of the silicon nitride film. The ONO film 121 may be formed over the entire surface of the semiconductor substrate 101, or only on the isolation regions 102 or a region on which ion implantation is to be performed on each of the nonvolatile memory region and the logic circuit region.

In this embodiment, the ion implantation for forming the well and the ion implantation for controlling the threshold voltage are performed on the logic circuit region using the same mask. However, these implantations may be performed using different masks.

In this embodiment, after the upper oxide film 105, the silicon nitride film 104 and the lower oxide film 103 have been etched in this order in the nonvolatile memory region using a mask, the n-type doped layer 107 is formed using the same mask. Alternatively, the ONO film 121 may be etched after the formation of the n-type doped layer 107.

Embodiment 3

FIGS. 7A through 7D, 8A, 8B, 9A, 9B, 10A through 10C and 11A through 11C are cross-sectional views showing respective process steps of a method for fabricating a semiconductor memory device according to a third embodiment of the present invention. In FIGS. 7A through 11C, left-side parts represent a nonvolatile memory region and right-side parts represent a logic circuit region.

Figure 7A:
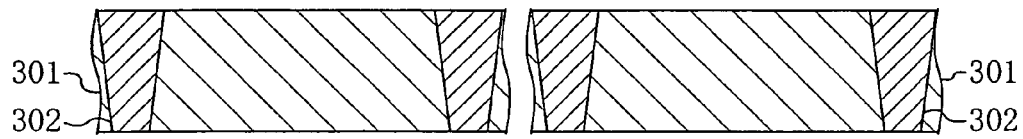
FIGS. 7A through 7D are cross-sectional views showing respective process steps of a method for fabricating a semiconductor memory device according to a third embodiment of the present invention.
Figure 7B:
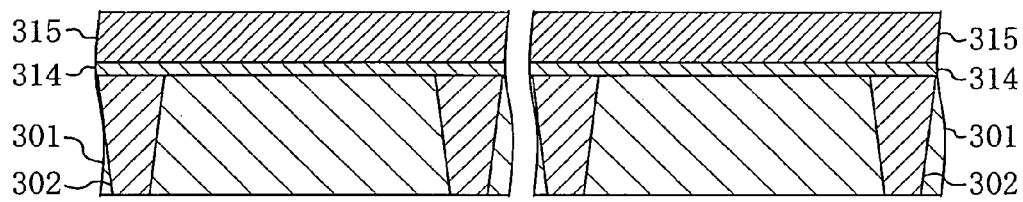

First, as shown in FIG. 7A, trenches are formed in a semiconductor substrate 301 made of silicon in a nonvolatile memory region and a logic circuit region, and then trench isolation regions 302 are formed. Then, as shown in FIG. 7B, a tunnel insulating film 314 of SiO$_2$ with a thickness of 10 nm is formed over the entire surface of the semiconductor substrate 301, and a polycrystalline silicon film 315 with a thickness of 200 nm to be a floating gate in the nonvolatile memory region is formed.

Figure 7C:
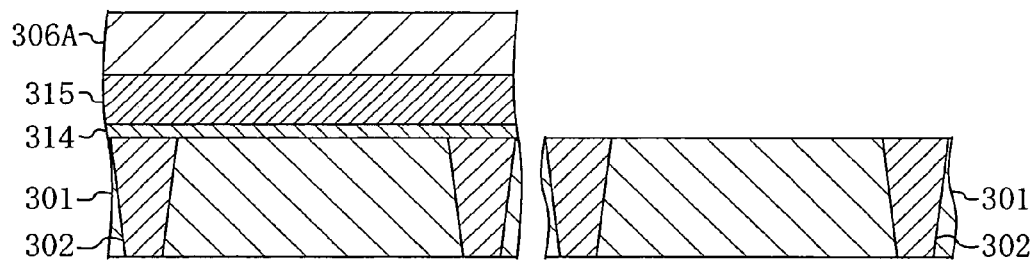
Figure 7D:
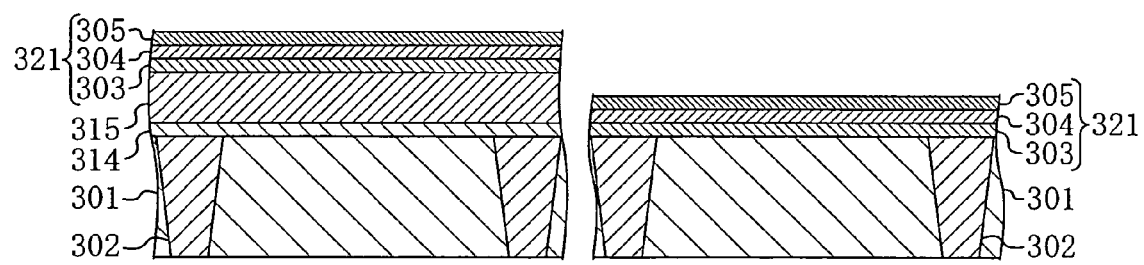

Next, as shown in FIG. 7C, the polycrystalline silicon film 315 and the tunnel insulating film 314 are removed in the logic circuit region using a photoresist 306A as a mask. Subsequently, as shown in FIG. 7D, a lower oxide film 303 of SiO$_2$ with a thickness of 7 nm, a silicon nitride film 304 of SiN with a thickness of 7 nm and an upper oxide film 305 of SiO$_2$ with a thickness of 12 nm are formed in this order, thereby forming an ONO film 321.

Figure 8A:
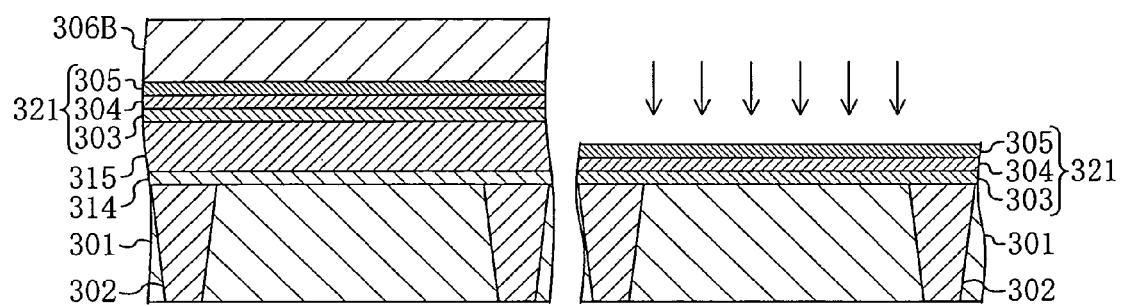
FIGS. 8A and 8B are cross-sectional views showing respective process steps of a method for fabricating a semiconductor memory device according to the third embodiment.

Then, as shown in FIG. 8A, ion implantation is performed on the logic circuit region using a photoresist 306B as a mask, thereby forming a well for a transistor which is to be formed in the logic circuit region and adjusting the threshold voltage of the transistor.

The ion implantation for forming the well for the transistor in the logic circuit region is performed by implanting boron at an implantation voltage of 300 keV at a density of $1\times10^{13}$ cm$^{-2}$, for example. The ion implantation for controlling the threshold voltage is performed at an implantation voltage of 30 keV at a density of $5\times10^{12}$ cm$^{-2}$, for example. In the ion implantations for forming the well and adjusting the threshold voltage, the ONO film 321 is used as a surface protective film.

Figure 8B:
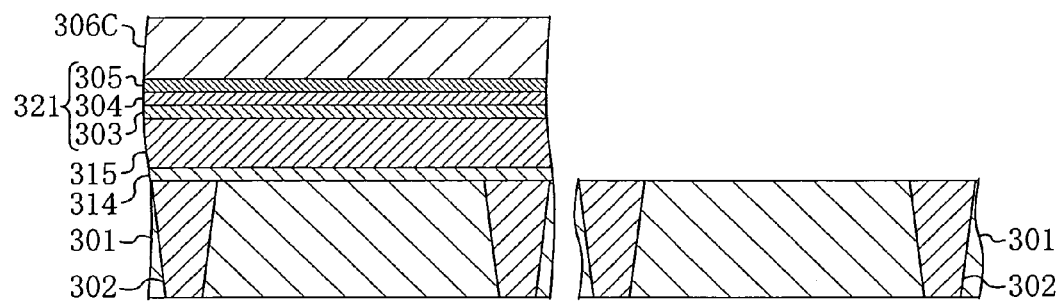

Then, as shown in FIG. 8B, the upper oxide film 305, the silicon nitride film 304 and the lower oxide film 303 are selectively removed in this order in the logic circuit region using a photoresist 306C as a mask.

Figure 9A:
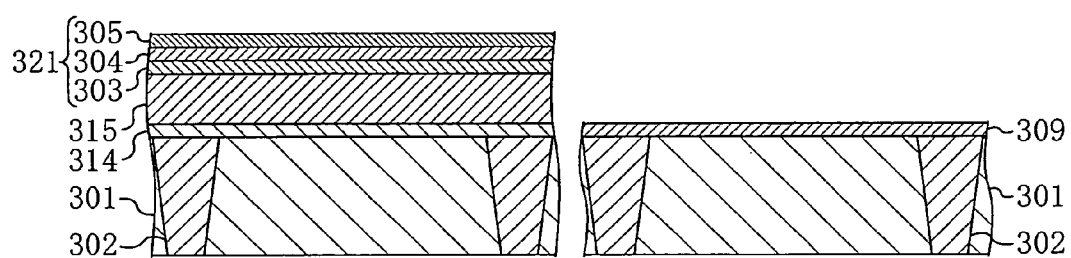
FIGS. 9A and 9B are cross-sectional views showing respective process steps of a method for fabricating a semiconductor memory device according to the third embodiment.
Figure 9B:
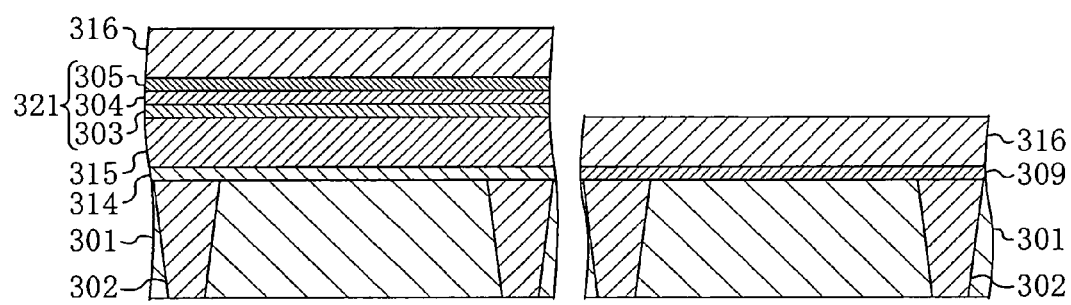
Figure 10A:
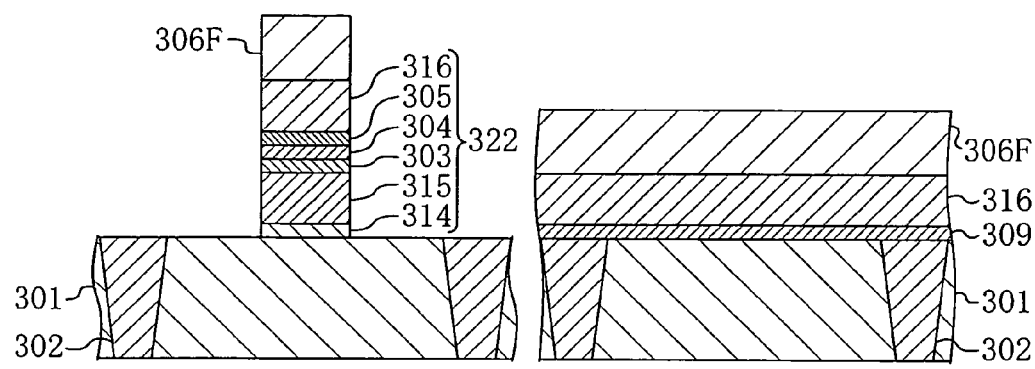
FIGS. 10A through 10C are cross-sectional views showing respective process steps of a method for fabricating a semiconductor memory device according to the third embodiment.

Thereafter, as shown in FIG. 9A, a gate insulating film 309 of $SiO_2$ with a thickness of 10 nm is formed in the logic circuit region. Subsequently, as shown in FIG. 9B, a polycrystalline silicon film 316 with a thickness of 200 nm to serve as a gate electrode in the logic circuit region and a control gate in the nonvolatile memory region is formed in the logic circuit region and the nonvolatile memory region. Then, as shown in FIG. 10A, the polycrystalline silicon film 316, the ONO film 321, the polycrystalline silicon film 315 and the tunnel insulating film 314 are etched in the nonvolatile memory region using a photoresist 306F as a mask, thereby forming a double gate structure 322 including a floating gate and a control gate.

Figure 10B:
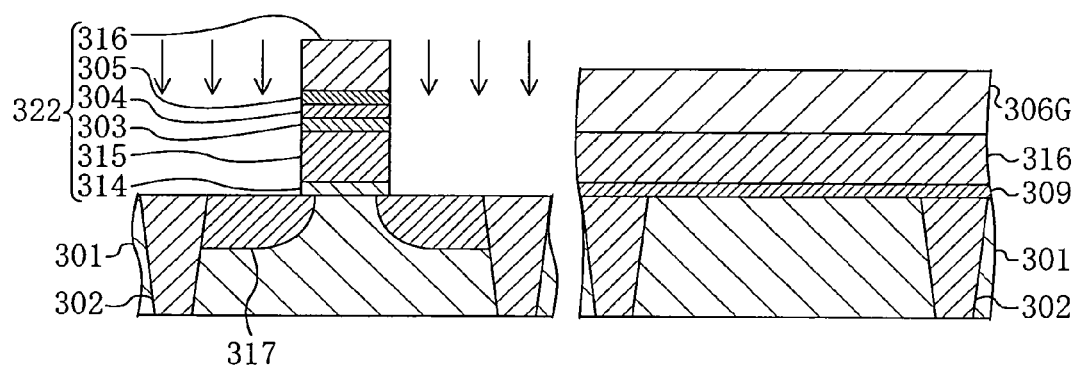

Subsequently, as shown in FIG. 10B, ion implantation is performed using a photoresist 306G as a mask, thereby forming a source/drain doped layer 317 in the nonvolatile memory region. This ion implantation only needs to be performed using arsenic as impurity ions at an implantation voltage of 30 keV at a density of $3 \times 10^{15}$ $cm^{-2}$, for example.

Figure 10C:
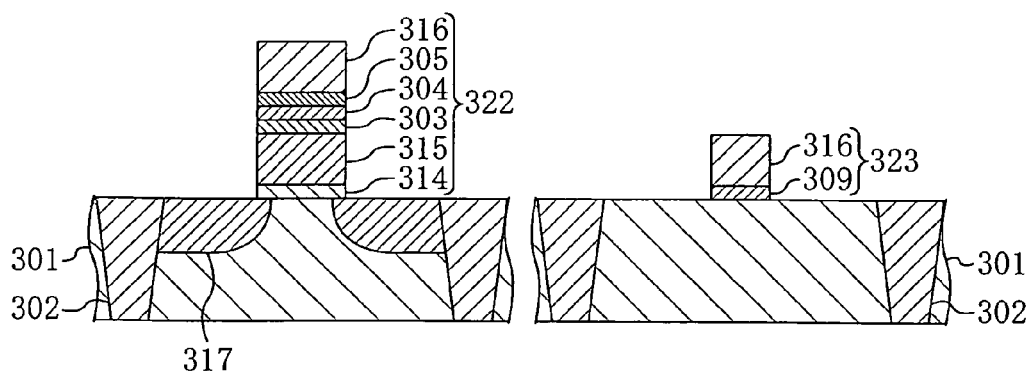

Thereafter, as shown in FIG. 10C, the polycrystalline silicon film 316 and the gate insulating film 309 are selectively etched in the logic circuit region using an appropriate mask (not shown), thereby forming a gate electrode 323.

Figure 11A:
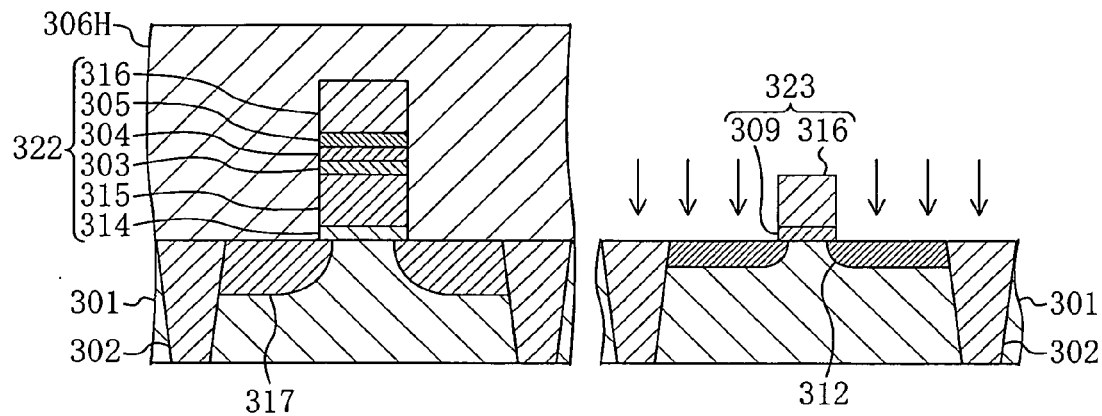
FIGS. 11A through 11C are cross-sectional views showing respective process steps of a method for fabricating a semiconductor memory device according to the third embodiment.
Figure 11B:
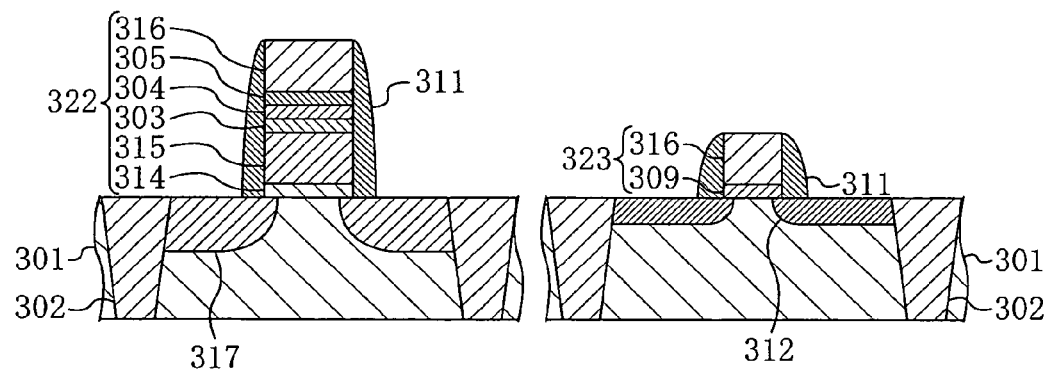
Figure 11C:
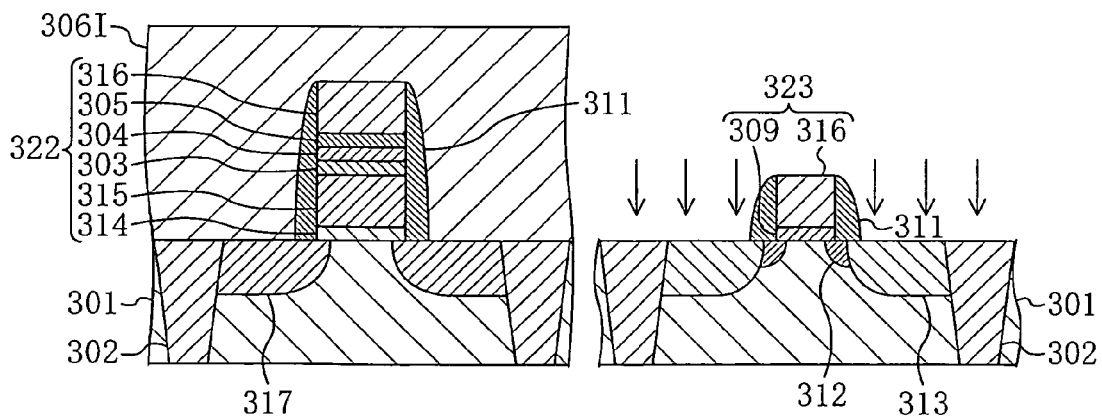

Then, as shown in FIG. 11A, ion implantation is performed using a photoresist 306H as a mask, thereby forming a lightly-doped layer 312. Subsequently, as shown in FIG. 11B, sidewalls 311 are respectively formed on gate electrodes 322 and 323. Then, as shown in FIG. 11C, a heavily-doped layer 313 is formed using a photoresist 306I as a mask, thus completing a semiconductor memory device.

As described above, with a method for fabricating a semiconductor memory device of this embodiment, isolation regions are appropriately protected even in the case of fabricating a semiconductor memory device in which a nonvolatile memory having a floating gate is incorporated. Accordingly, a highly-reliable semiconductor memory device is obtained. In addition, the ONO film for protecting the isolation regions is made of a film which is also used as a capacitive film for a nonvolatile memory, so that the isolation regions are protected without an increase of the number of processes.

In addition, the ONO film 321 is used as a surface protective film during the ion implantation. Accordingly, the process of the ion implantation can be simplified.

Furthermore, the ONO film 321 is removed in the logic circuit region after the ion implantation, so that no parasitic transistor is formed on the isolation regions and thus the property of isolating transistors from each other is not degraded. A transistor in the resultant logic circuit has the same structure as that obtained by a usual process of forming only a logic circuit. Accordingly, in the case where debugging is performed by using a device including a nonvolatile memory and then a device from which the nonvolatile memory is removed is made commercially available, it is unnecessary to change the design of the logic circuit, for example.

In this embodiment, the ONO film 321 serves as a trap film in the nonvolatile memory region and also as a protective film in the logic circuit region. Alternatively, only a silicon nitride film or a multilayer film made of a lower oxide film and a silicon nitride film may be used. A silicon oxynitride film (SiON) may be used instead of the silicon nitride film. The ONO film 321 may be formed over the entire surface of the semiconductor substrate 301, or only on the isolation regions 302 or a region on which ion implantation is to be performed in each of the nonvolatile memory region and the logic circuit region.

In this embodiment, the ion implantation for forming the well and the ion implantation for controlling the threshold voltage are performed on the logic circuit region using the same mask. However, these implantations may be performed using different masks.

Embodiment 4

FIGS. 12A through 12D, 13A through 13D, 14A, 14B, 15A through 15C and 16A through 16C are cross-sectional views showing respective process steps of a method for fabricating a semiconductor memory device according to a fourth embodiment of the present invention. In FIGS. 12A through 16C, left-side parts represent a nonvolatile memory region and right-side parts represent a logic circuit region.

Figure 12A:
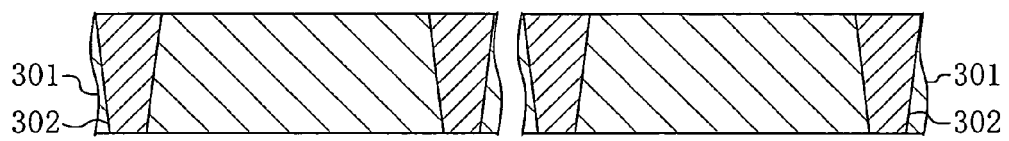
FIGS. 12A through 12D are cross-sectional views showing respective process steps of a method for fabricating a semiconductor memory device according to a fourth embodiment of the present invention.
Figure 12B:
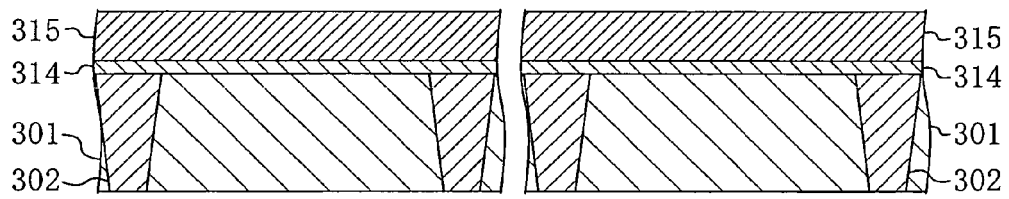

First, as shown in FIG. 12A, trenches are formed in a semiconductor substrate 301 made of silicon in a nonvolatile memory region and a logic circuit region, and then trench isolation regions 302 are formed. Then, as shown in FIG. 12B, a tunnel insulating film 314 of $SiO_2$ with a thickness of 10 nm is formed over the entire surface of the semiconductor substrate 301, and a polycrystalline silicon film 315 with a thickness of 200 nm to be a floating gate in the nonvolatile memory region is formed.

Figure 12C:
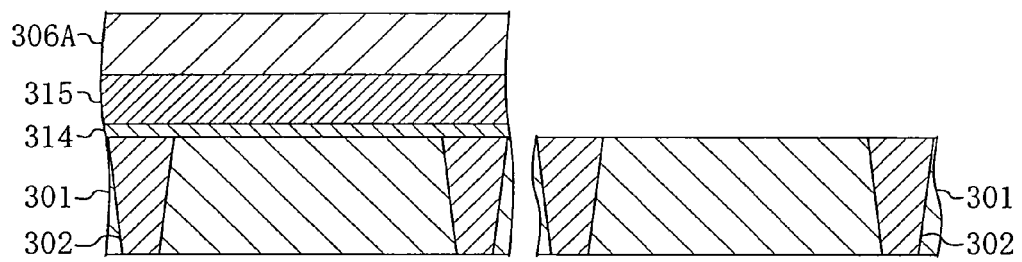
Figure 12D:
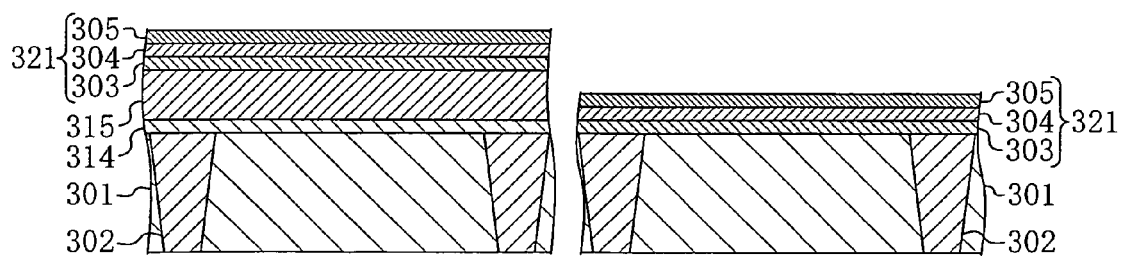

Next, as shown in FIG. 12C, the polycrystalline silicon film 315 and the tunnel insulating film 314 are removed in the logic circuit region using a photoresist 306A as a mask. Subsequently, as shown in FIG. 12D, a lower oxide film 303 of $SiO_2$ with a thickness of 7 nm, a silicon nitride film 304 of SiN with a thickness of 7 nm and an upper oxide film 305 of $SiO_2$ with a thickness of 12 nm are formed in this order, thereby forming an ONO film 321.

Figure 13A:
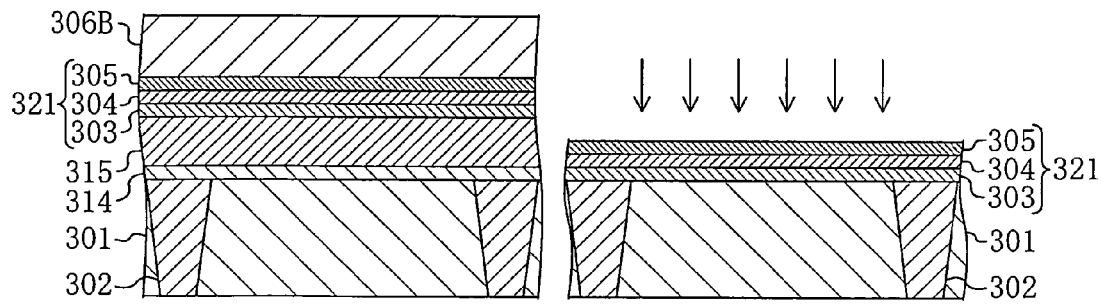
FIGS. 13A through 13D are cross-sectional views showing respective process steps of a method for fabricating a semiconductor memory device according to the fourth embodiment.

Then, as shown in FIG. 13A, ion implantation is performed on the logic circuit region using a photoresist 306B as a mask, thereby forming a well for a transistor which is to be formed in the logic circuit region.

Figure 13B:
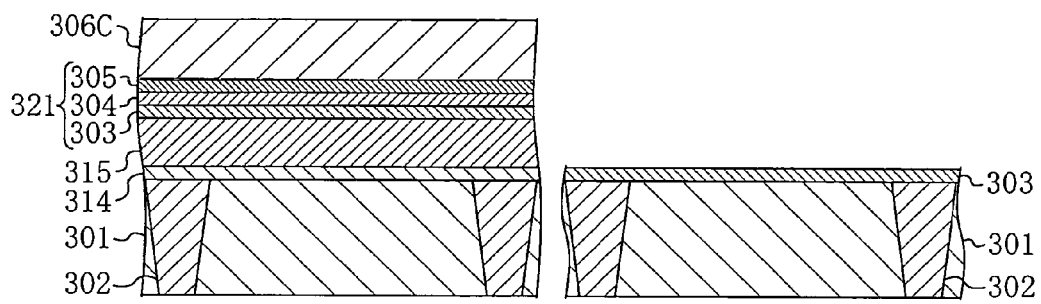
Figure 13C:
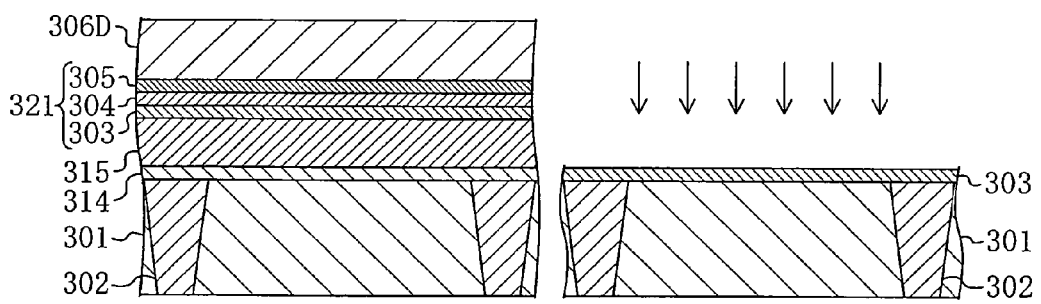

After the formation of the well, as shown in FIG. 13B, etching is performed using a photoresist 306C as a mask, thereby removing the upper oxide film 305 and the silicon nitride film 304 in the logic circuit region. Subsequently, as shown in FIG. 13C, ion implantation is performed on the logic circuit region using a photoresist 306D as a mask, thereby adjusting a threshold voltage.

The ion implantation for forming the well for the transistor in the logic circuit region is performed by implanting boron at an implantation voltage of 300 keV at a density of $1 \times 10^{13}$ $cm^{-2}$, for example. The ion implantation for controlling the threshold voltage is performed at an implantation voltage of 30 keV at a density of $5 \times 10^{12}$ $cm^{-2}$, for example.

In the ion implantation for forming the well, the ONO film 321 made of the three layers of the upper oxide film 305, the silicon nitride film 304 and the lower oxide film 303 is used as a surface protective film. In the ion implantation for adjusting the threshold voltage, only the lower oxide film 303 is used as a surface protective film.

Figure 13D:
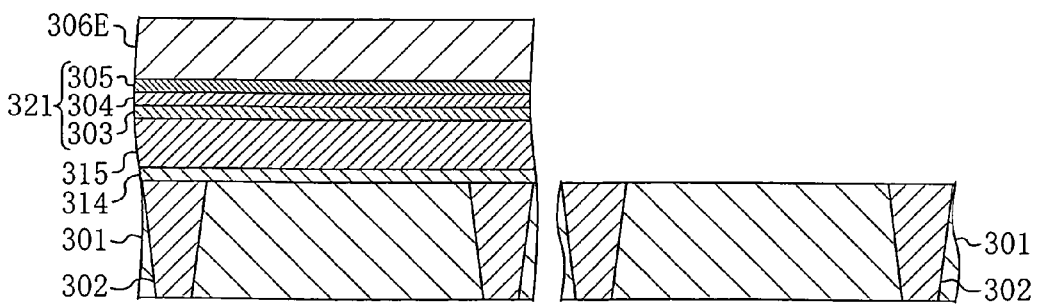

Then, as shown in FIG. 13D, the lower oxide film 303 is selectively removed in the logic circuit region using a photoresist 306E as a mask.

Figure 14A:
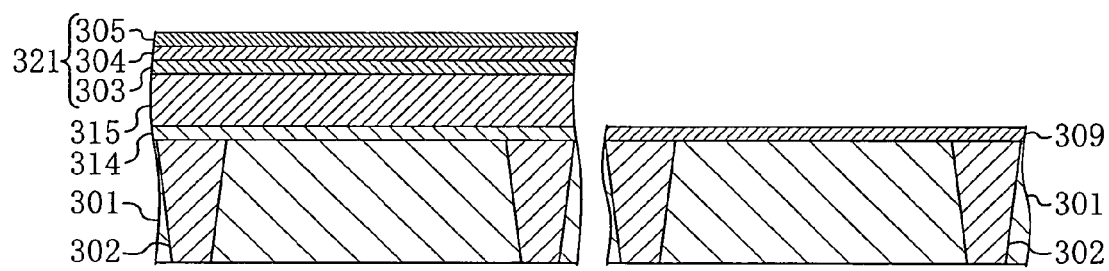
FIGS. 14A and 14B are cross-sectional views showing respective process steps of a method for fabricating a semiconductor memory device according to the fourth embodiment.
Figure 14B:
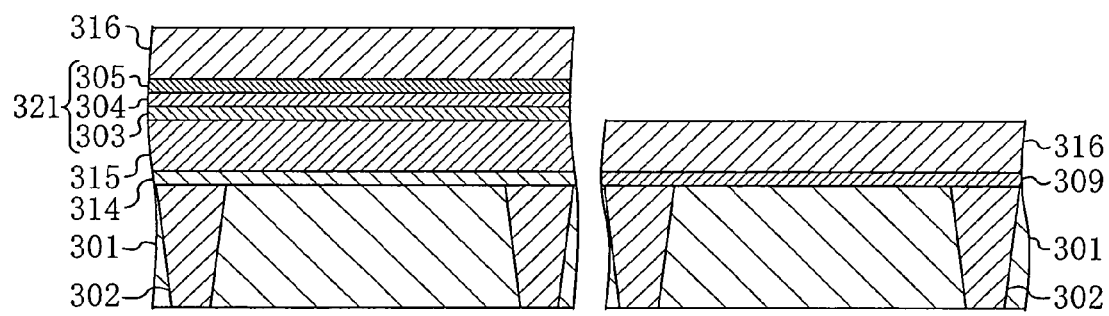
Figure 15A:
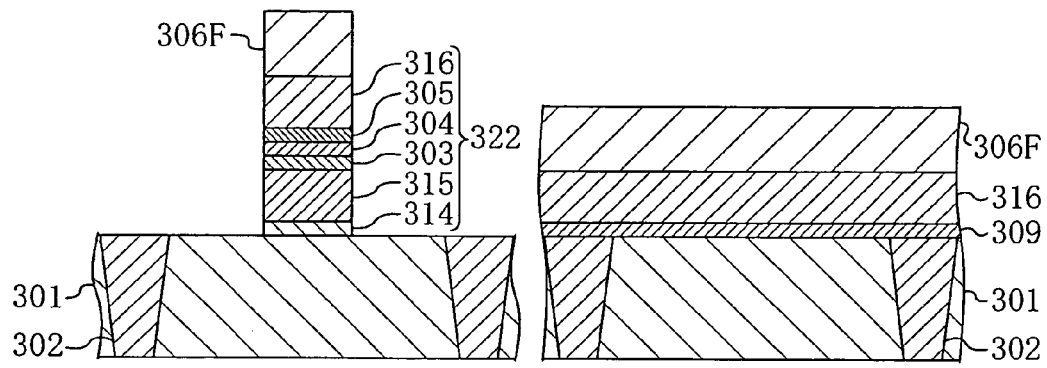
FIGS. 15A through 15C are cross-sectional views showing respective process steps of a method for fabricating a semiconductor memory device according to the fourth embodiment.

Thereafter, as shown in FIG. 14A, a gate insulating film 309 of $SiO_2$ with a thickness of 10 nm is formed in the logic circuit region. Subsequently, as shown in FIG. 14B, a polycrystalline silicon film 316 with a thickness of 200 nm to serve as a gate electrode in the logic circuit region and a control gate in the nonvolatile memory region is formed in the logic circuit region and the nonvolatile memory region. Then, as shown in FIG. 15A, the polycrystalline silicon film 316, the ONO film 321, the polycrystalline silicon film 315 and the tunnel insulating film 314 are etched in the nonvolatile memory region using a photoresist 306F as a mask, thereby forming a double gate structure 322 including a floating gate and a control gate.

Figure 15B:
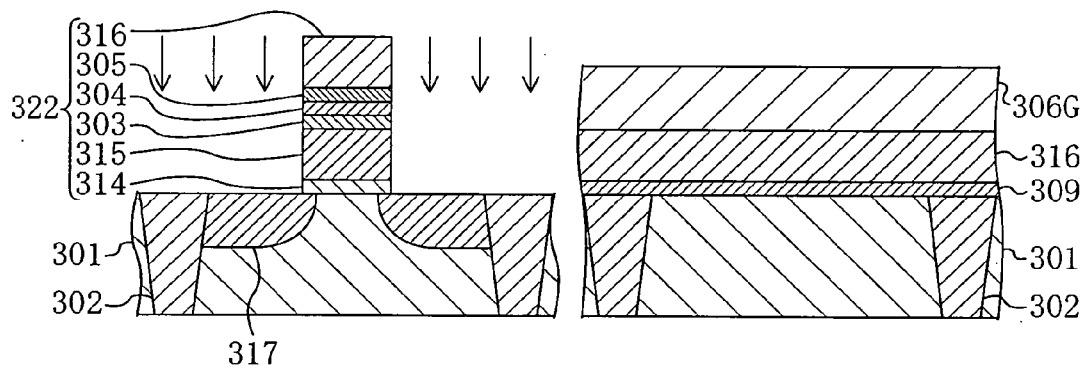

Subsequently, as shown in FIG. 15B, ion implantation is performed using a photoresist 306G as a mask, thereby forming a source/drain doped layer 317 in the nonvolatile memory region. The ion implantation only needs to be performed using arsenic as impurity ions at an implantation voltage of 30 keV at a density of $3 \times 10^{15}$ cm$^{-2}$, for example.

Figure 15C:
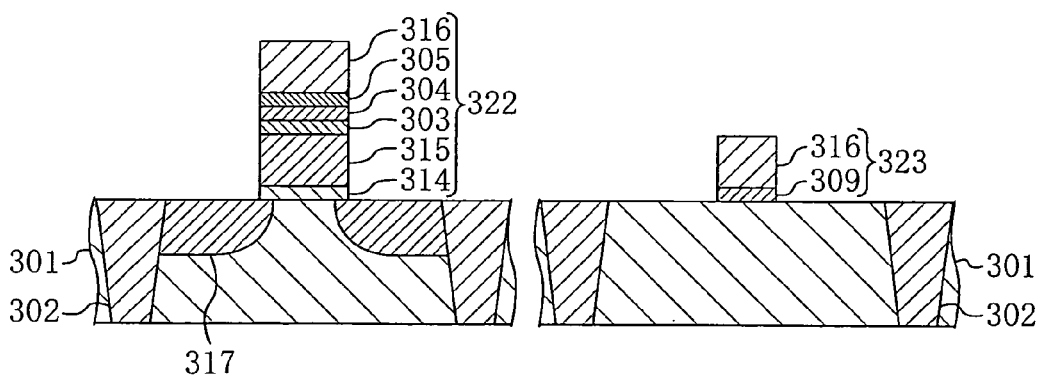

Thereafter, as shown in FIG. 15C, the polycrystalline silicon film 316 and the gate insulating film 309 are selectively etched in the logic circuit region using an appropriate mask (not shown), thereby forming a gate electrode 323.

Figure 16A:
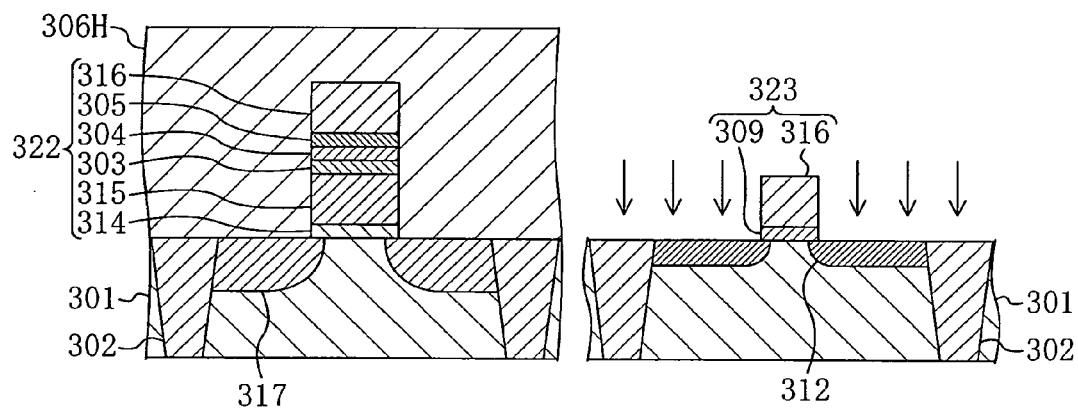
FIGS. 16A through 16C are cross-sectional views showing respective process steps of a method for fabricating a semiconductor memory device according to the fourth embodiment.
Figure 16B:
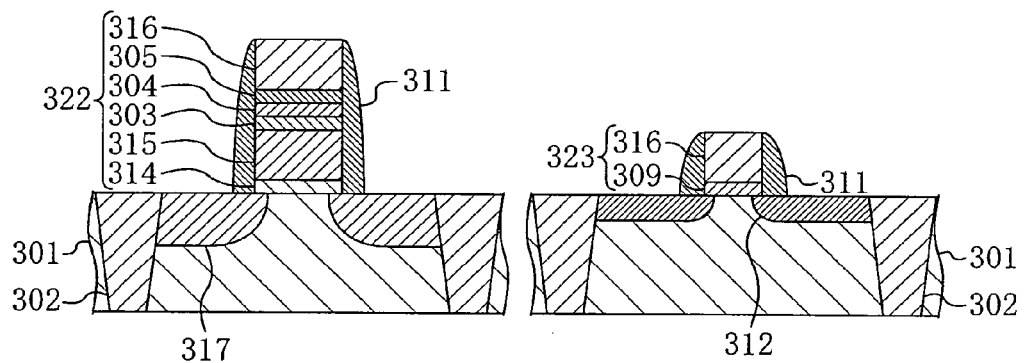
Figure 16C:
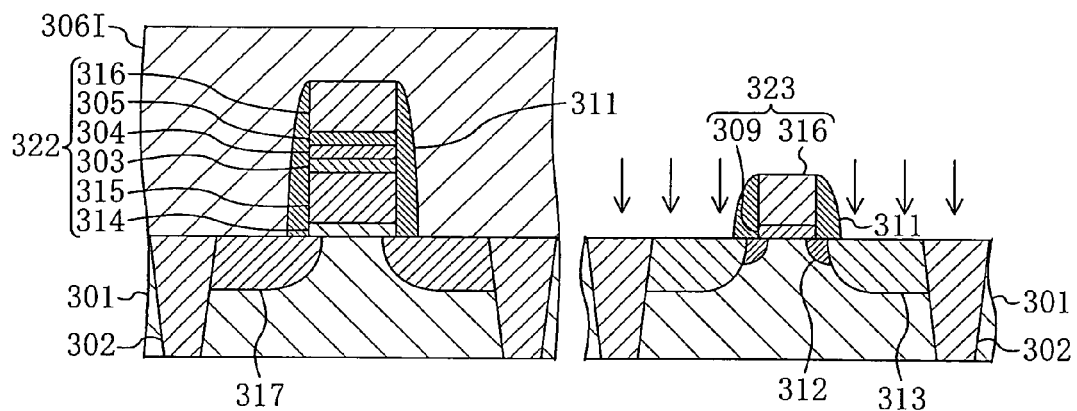

Then, as shown in FIG. 16A, ion implantation is performed using a photoresist 306H as a mask, thereby forming a lightly-doped layer 312. Subsequently, as shown in FIG. 16B, sidewalls 311 are respectively formed on gate electrodes 322 and 323. Then, as shown in FIG. 16C, a heavily-doped layer 313 is formed using a photoresist 306I as a mask, thus completing a semiconductor memory device.

As described above, with a method for fabricating a semiconductor memory device of this embodiment, isolation regions are appropriately protected even in the case of fabricating a semiconductor memory device a nonvolatile memory having a floating gate is incorporated. Accordingly, a highly-reliable semiconductor memory device is obtained. In addition, the ONO film for protecting the isolation regions is made of a film which is also used as a capacitive film for a nonvolatile memory, so that the isolation regions are protected without an increase of the number of processes.

In this embodiment, the ONO film made of the three layers of the upper oxide film, the silicon nitride film and the lower oxide film is used as a surface protective film during the formation of the well, whereas only the lower oxide film is used as a surface protective film during the ion implantation for adjusting the threshold voltage. In the adjustment of the threshold voltage, ion implantation need to be performed on a part as shallow as possible in the semiconductor substrate in order to reduce the size of a transistor. In this embodiment, the upper oxide film and the silicon nitride film are removed so that ion implantation is performed through a thin surface protective film. Accordingly, ion implantation is easily performed on a shallower part, thus enabling miniaturization of a transistor with ease.

Furthermore, the ONO film 321 is removed in the logic circuit region after the ion implantation, so that no parasitic transistor is formed on the isolation regions and thus the property of isolating transistors from each other is not degraded. A transistor in the resultant logic circuit has the same structure as that obtained by a usual process of forming only a logic circuit. Accordingly, in the case where debugging is performed by using a device including a nonvolatile memory and then a device from which the nonvolatile memory is removed is made commercially available, it is unnecessary to change the design of the logic circuit, for example.

In this embodiment, the ONO film 321 serves as a trap film in the nonvolatile memory region and also as a protective film in the logic circuit region. Alternatively, only a silicon nitride film or a multilayer film made of a lower oxide film and a silicon nitride film may be used. A silicon oxynitride film (SiON) may be used instead of the silicon nitride film. The ONO film 321 may be formed over the entire surface of the semiconductor substrate 301, or only on the isolation regions 302 or a region on which ion implantation is to be performed in each of the nonvolatile memory region and the logic circuit region.

In this embodiment, the ion implantation for forming the well and the ion implantation for controlling the threshold voltage are performed on the logic circuit region using the same mask. However, these implantations may be performed using different masks.

Embodiment 5

Figure 17:
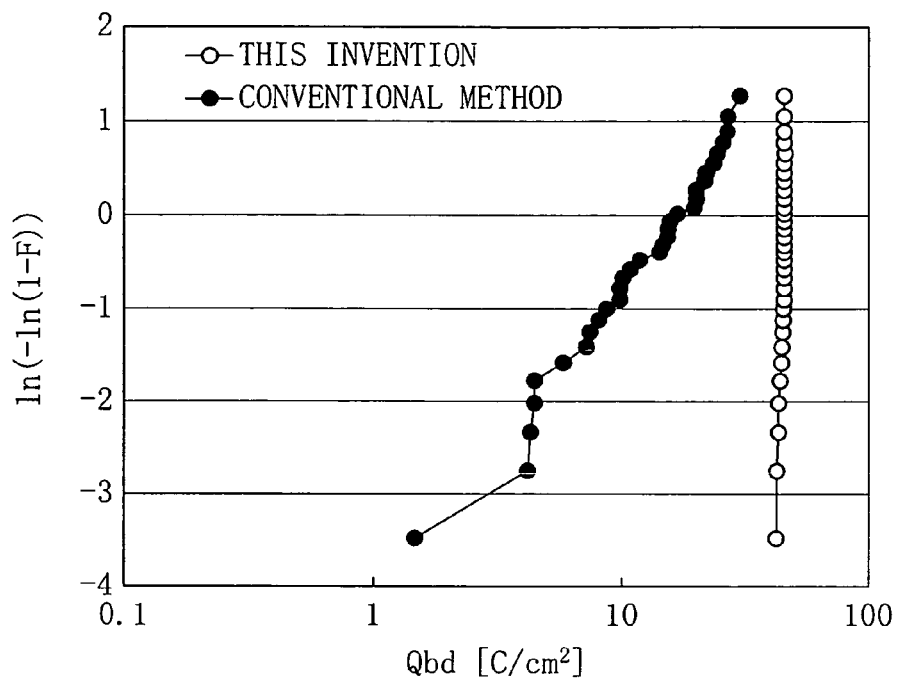
FIG. 17 is a Weibull plot showing a distribution of charge-to-breakdown (Qbd) of a gate insulating film of a semiconductor memory device fabricated with a method for fabricating a semiconductor memory device according to the present invention.

FIG. 17 shows a result of a Weibull plot of charge-to-breakdown (Qbd) of a gate insulating film of a semiconductor memory device fabricated with a method for fabricating a semiconductor memory device according to the present invention. The semiconductor memory device used for this measurement was fabricated with the method of the first embodiment. As a conventional semiconductor memory device, a semiconductor memory device fabricated with no ONO film provided in a logic circuit region was used for comparison. In each of the devices, the thickness of the gate insulating film was 15 nm. The total area of a transistor array of each of the semiconductor memory devices used for this measurement was 0.04 cm$^2$ and current applied for the measurement was −100 mA/cm$^2$.

As shown in FIG. 17, in the semiconductor memory device fabricated with a conventional method in which no ONO film is provided in a logic circuit region so that isolation regions are not protected, the Qbd value greatly changes in the range from about 1 C/cm$^2$ to about 30 C/cm$^2$. On the other hand, in the semiconductor memory device fabricated with a method of the present invention in which isolation regions are not protected by an ONO film, the Qbd value is about 50 C/cm$^2$, which is larger than that in the device fabricated by the conventional method. In addition, in the device fabricated by the method of the present invention, the distribution range is small, and a highly-reliable gate oxide film with high quality and a small distribution range is obtained.

Figure 18:
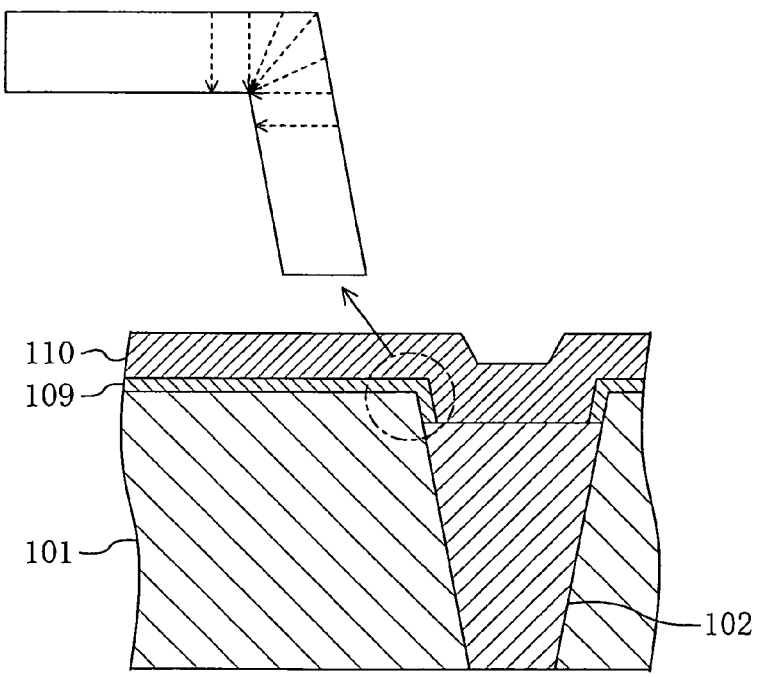
FIG. 18 is a view schematically showing how the reliability of a gate oxide film declines.
Figure 19A:
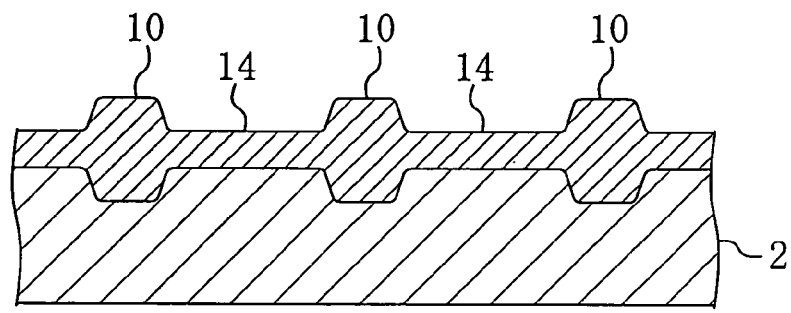
FIGS. 19A through 19C are cross-sectional views showing respective process steps of a conventional method for fabricating a semiconductor memory device.
Figure 19B:
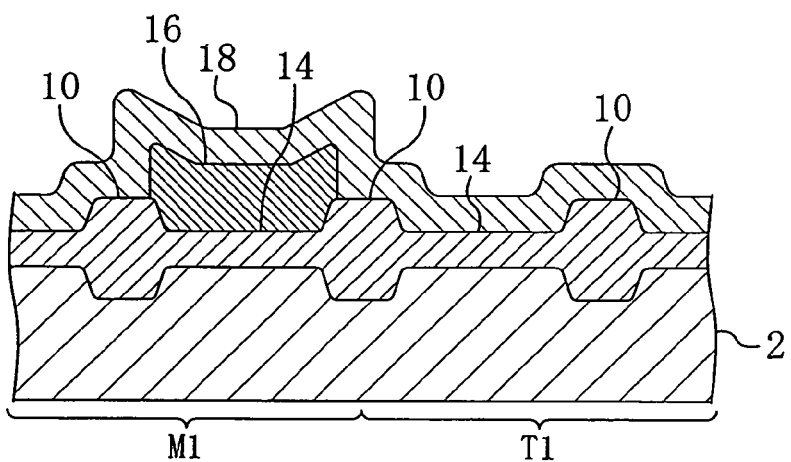
Figure 19C:
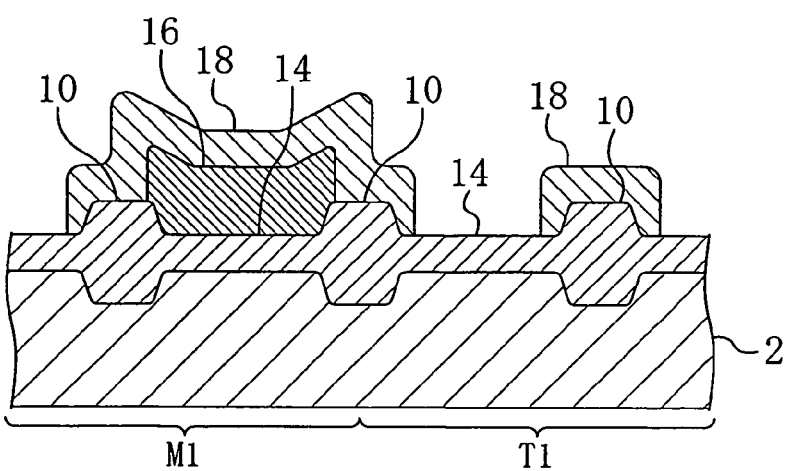

This is because the isolation regions are not protected during the formation of a nonvolatile memory so that the thickness of an insulating film buried in a trench serving as an isolation region is reduced in the semiconductor memory device fabricated with the conventional method. As a result of the thickness reduction of the insulating film as shown in FIG. 18, the top of the insulating film is lower than the surface of the semiconductor substrate, so that an electric field is concentrated at the end of the trench. This degrades the reliability of the gate oxide film.

On the other hand, in the semiconductor memory device fabricated with the method of the present invention, the isolation regions are protected by the ONO film so that the thickness of the film in the isolation regions is hardly reduced, and no concentration of the electric field occurs. Accordingly, with the fabrication method of the present invention, a highly-reliable semiconductor memory device with high performance is implemented.

In this manner, with the method for fabricating a semiconductor memory device of the present invention, it is possible to prevent deterioration of characteristics of a logic circuit caused by a protective film remaining in isolation regions, so that a highly-reliable semiconductor memory device is implemented without complicated fabrication processes. Accordingly, the method of the present invention is useful as a method for fabricating a semiconductor device in which a logic circuit and a nonvolatile memory are incorporated, for example.

What is claimed is:

1. A method for fabricating a semiconductor memory device in which a logic circuit and a nonvolatile memory are provided on a semiconductor substrate, the method comprising the steps of:
    forming a trench in the semiconductor substrate and burying an insulating film in the trench, thereby forming an isolation region;
    forming a protective film made of an insulating material over the semiconductor substrate in a logic circuit region where the logic circuit is to be formed and a nonvolatile memory region where the nonvolatile memory is to be formed;
    selectively introducing impurity ions in part of the semiconductor substrate in the logic circuit region;
    removing the protective film formed over the logic circuit region;
    forming a first conductive film on the semiconductor substrate in the nonvolatile memory region after the step of forming the isolation region has been performed and before the step of forming the protective film is performed; and
    forming a second conductive film on the protective film after the step of forming the protective film has been performed,
    wherein the step of introducing the impurity ions is performed before the step of removing the protective film is performed, and
    the protective film serves as an insulating film for insulating the first conductive film and the second conductive film from each other.

2. The method of claim 1, wherein the protective film is made of a material having a lower etching rate with respect to hydrofluoric acid than that of the insulating film buried in the trench.

3. The method of claim 1, wherein the protective film is made of a material having a lower etching rate with respect to a mixed solution including ammonia water and hydrogen peroxide than that of the insulating film buried in the trench.

4. The method of claim 1, wherein the protective film is a single layer of either a silicon nitride film or a silicon oxynitride film.

5. The method of claim 1, wherein the protective film is a multilayer film made of a plurality of insulating films including at least one of a silicon nitride film and a silicon oxynitride film.

6. The method of claim 5, wherein the multilayer film is a stack of a silicon oxide film, either a silicon nitride film or a silicon oxynitride film, and a silicon oxide film.

7. The method of claim 5, wherein the step of introducing the impurity ions includes a first impurity introducing step for forming a well and a second impurity introducing step for controlling a threshold voltage, and
    the method further comprises the step of selectively removing at least one of the plurality of insulating films before the second impurity introducing step is performed.

8. A method for fabricating a semiconductor memory device in which a logic circuit and a nonvolatile memory are provided on a semiconductor substrate, the method comprising the steps of:
    forming a trench in the semiconductor substrate and burying an insulating film in the trench, thereby forming an isolation region;
    forming a protective film made of an insulating material over the semiconductor substrate in a logic circuit region where the logic circuit is to be formed and a nonvolatile memory region where the nonvolatile memory is to be formed;
    selectively introducing impurity ions in part of the semiconductor substrate in the logic circuit region; and
    removing the protective film formed over the logic circuit region,
    wherein the step of introducing the impurity ions is performed before the step of removing the protective film is performed,
    the protective film formed over the nonvolatile memory region is to serve as a trap film that accumulates charge in a memory formed in the nonvolatile memory region, and
    the protective film is made of a material having a lower etching rate with respect to hydrofluoric acid than that of the insulating film buried in the trench.

9. A method for fabricating a semiconductor memory device in which a logic circuit and a nonvolatile memory are provided on a semiconductor substrate, the method comprising the steps of:
    forming a trench in the semiconductor substrate and burying an insulating film in the trench, thereby forming an isolation region;
    forming a protective film made of an insulating material over the semiconductor substrate in a logic circuit region where the logic circuit is to be formed and a nonvolatile memory region where the nonvolatile memory is to be formed;
    selectively introducing impurity ions in part of the semiconductor substrate in the logic circuit region; and
    removing the protective film formed over the logic circuit region,
    wherein the step of introducing the impurity ions is performed before the step of removing the protective film is performed,
    the protective film formed over the nonvolatile memory region is to serve as a trap film that accumulates charge in a memory formed in the nonvolatile memory region, and
    the protective film is made of a material having a lower etching rate with respect to a mixed solution including ammonia water and hydrogen peroxide than that of the insulating film buried in the trench.

10. A method for fabricating a semiconductor memory device in which a logic circuit and a nonvolatile memory are provided on a semiconductor substrate, the method comprising the steps of:
    forming a trench in the semiconductor substrate and burying an insulating film in the trench, thereby forming an isolation region;
    forming a protective film made of an insulating material over the semiconductor substrate in a logic circuit region where the logic circuit is to be formed and a nonvolatile memory region where the nonvolatile memory is to be formed;
    selectively introducing impurity ions in part of the semiconductor substrate in the logic circuit region; and
    removing the protective film formed over the logic circuit region,
    wherein the step of introducing the impurity ions is performed before the step of removing the protective film is performed,
    the protective film formed over the nonvolatile memory region is to serve as a trap film that accumulates charge in a memory formed in the nonvolatile memory region, and the protective film is a multilayer film made of a plurality of insulating films including at least one of a silicon nitride film and a silicon oxynitride film.

11. The method of claim 10, wherein the multilayer film is a stack of a silicon oxide film, either a silicon nitride film or a silicon oxynitride film, and a silicon oxide film.

12. The method of claim 10, wherein the step of introducing the impurity ions includes a first impurity introducing step for forming a well and a second impurity introducing step for controlling a threshold voltage, and the method further comprises the step of selectively removing at least one of the plurality of insulating films before the second impurity introducing step is performed.

* * * * *